US006204606B1

(12) United States Patent
Spence et al.

(10) Patent No.: US 6,204,606 B1
(45) Date of Patent: Mar. 20, 2001

(54) SLOTTED WAVEGUIDE STRUCTURE FOR GENERATING PLASMA DISCHARGES

(75) Inventors: Paul D. Spence, Greenville, SC (US); W. Edward Deeds, Knoxville, TN (US)

(73) Assignee: The University of Tennessee Research Corporation, Knoxville, TN (US)

( * ) Notice: Subject to any disclaimer, the term of this patent is extended or adjusted under 35 U.S.C. 154(b) by 0 days.

(21) Appl. No.: 09/406,907

(22) Filed: Sep. 28, 1999

Related U.S. Application Data

(60) Provisional application No. 60/102,641, filed on Oct. 1, 1998.

(51) Int. Cl.[7] ...................................................... H05H 1/46
(52) U.S. Cl. .............................. 315/111.21; 313/231.31; 118/723 ME
(58) Field of Search ................. 315/111.21; 313/231.31; 118/723 MW, 723 ME; 156/345

(56) References Cited

U.S. PATENT DOCUMENTS

| | | | |
|---|---|---|---|
| 4,767,641 | 8/1988 | Kieser et al. | 156/345 |
| 5,567,241 | 10/1996 | Tsu et al. | 118/723 MW |
| 5,843,236 | 12/1998 | Yoshiki et al. | 118/723 MR |

*Primary Examiner*—Justin P. Bettendorf
(74) *Attorney, Agent, or Firm*—Steve Mendelsohn

(57) ABSTRACT

A waveguide structure has at least one shaped slot machined in the wall of the waveguide. The slot is configured such that a high voltage is generated across the slot when the waveguide is suitably excited with high-power microwaves. The strong electric fields generated in the region of the slot can be used to produce a non-equilibrium plasma discharge in a working gas introduced in the vicinity of the slot. Various substrates can be translated past the slot and exposed to the plasma species generated by the microwave discharge. The slotted waveguide structure is designed to operate as a traveling wave structure with microwave energy uniformly dissipated along the length of the slot. Several methods are disclosed for providing uniform power dissipation. These methods include changing the dimensions of the waveguide, altering the position and shape of the wall slot, coupling power into the waveguide by means of auxiliary sources, and using an auxiliary ground plane. The auxiliary ground plane can also serve as a secondary electrode for the application of a low-frequency voltage for the enhancement of high-pressure operation. Altering the background gas pressure, gas composition, gas flow rate, and gas flow pattern provide additional ways to affect the plasma discharge. The structure can be designed to operate over the pressure range of about 10 Torr to atmospheric pressure (i.e., about 760 Torr) using a wide variety of gases and gas mixtures.

62 Claims, 18 Drawing Sheets

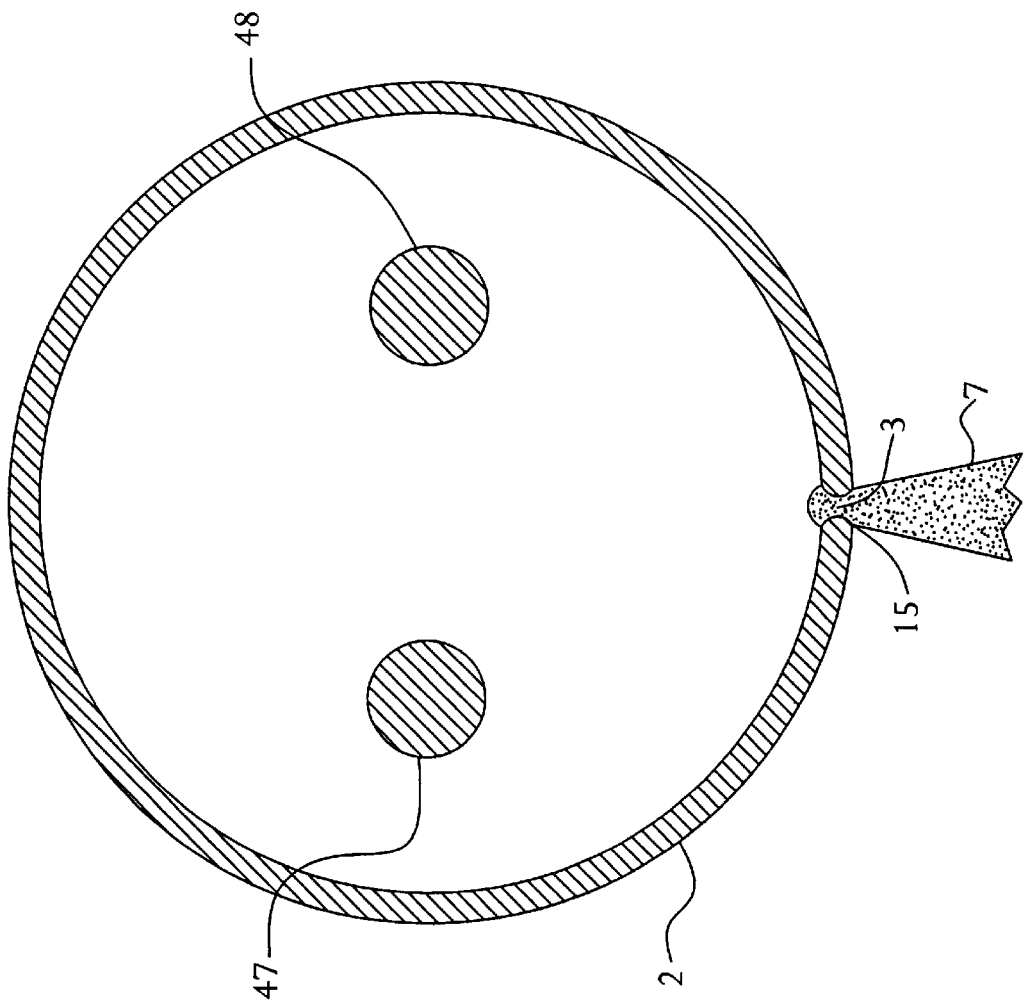

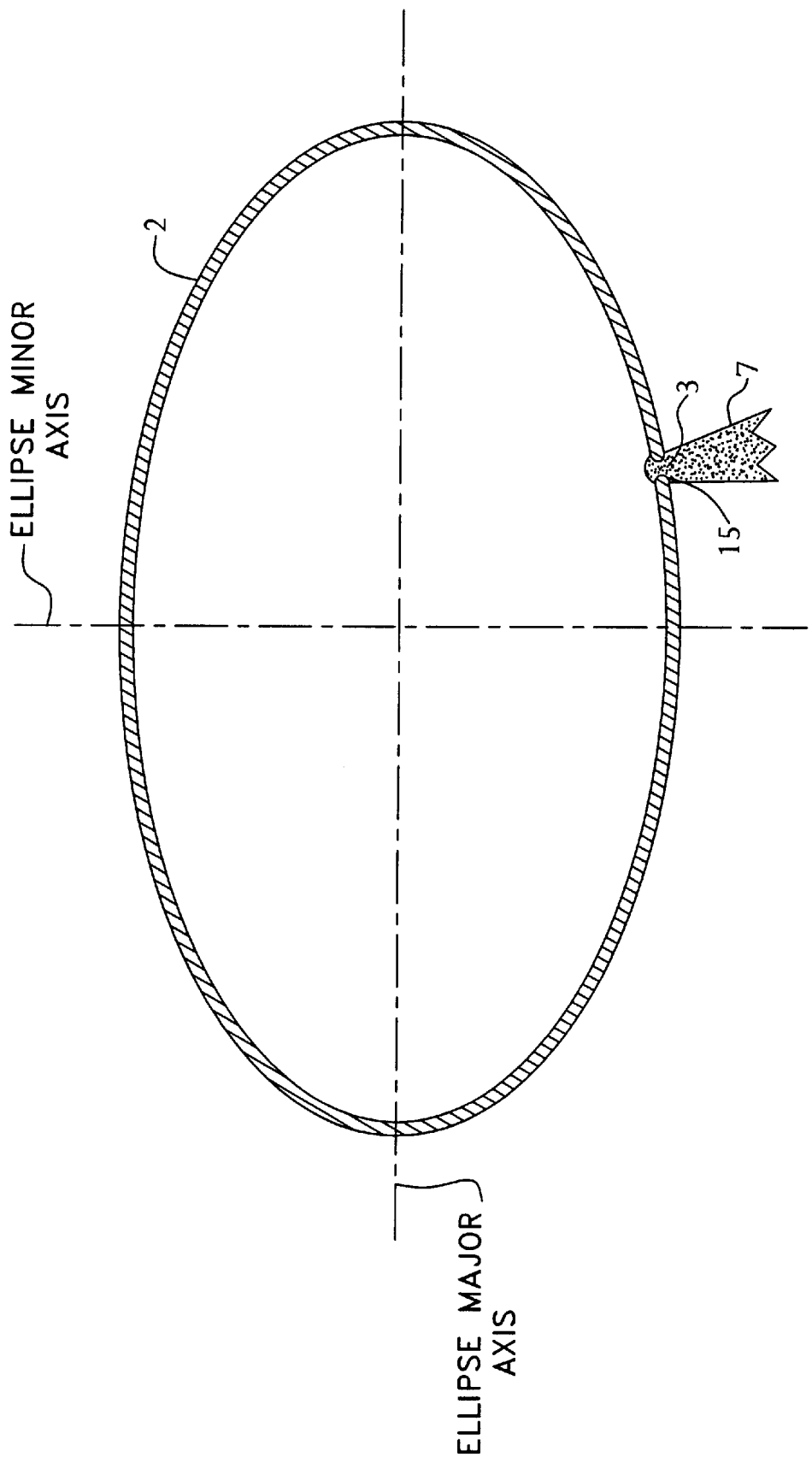

SLOTTED WAVEGUIDE STRUCTURE FOR GENERATING PLASMA DISCHARGES

CROSS-REFERENCE TO RELATED APPLICATIONS

This application claims the benefit of the filing date of U.S. provisional application No. 60/102,641, filed on Oct. 01, 1998 as attorney docket no. 372.6690PR0V.

BACKGROUND OF THE INVENTION

1. Field of the Invention

The present invention relates to plasma discharges, and, in particular, to moderate- to high-pressure non-equilibrium plasma discharges for materials processing applications.

2. Description of the Related Art

Plasma surface modification of large web or film substrates using a cold, non-equilibrium plasma has traditionally been accomplished using corona treatments at atmospheric pressure or as a batch process in low-pressure plasma reactors. Corona treaters are frequently used to activate the surface of a polymer for printing or laminating, and predominantly use atmospheric air as the working gas. Corona treaters are usually configured as a dielectric barrier discharge and excited using a low-frequency signal in the frequency range of 60 Hz to 30 kHz. Because of the chemistry restricted by the use of air and the nature of the plasma generated, corona treatment is rather limited compared to low-pressure treatments. Low-pressure treatments can employ a variety of gas chemistries and discharge techniques to obtain a wide range of surface modifications and therefore enhance the utility of a polymer substrate.

Low-pressure microwave discharges, in particular, have been shown to be more efficient at producing ion-electron pairs than lower frequency discharges. For a given input power, a microwave discharge operating in the gigahertz frequency range is capable of generating a higher number density of ion-electron pairs and excited-state species than is a low-frequency RF discharge operating in the megahertz range or the dielectric barrier discharge operating in the kilohertz frequency range. A microwave discharge using common gases such as nitrogen or oxygen an lead to significant surface functionalization of polymer surfaces.

Microwave discharge techniques however are typically restricted to low-pressure operation. A variety of low-pressure microwave discharge techniques have been employed for many years in the processing of semiconductor substrates. These techniques usually operate at pressures of one Torr or less and generate plasmas capable of treating substrates of only modest surface area. For the in-line processing of wide substrates ($1 \geq 0.2$ meter), the requirement of a low-pressure ($P \leq 1$ Torr) discharge is difficult to obtain and expensive due to vacuum pumping costs. The high efficiency of a microwave discharge, and its ability to effectively functionalize a polymer surface, make microwave discharges desirable for the in-line treatment of various webs and films.

High-power microwaves have been used to produce high-pressure, non-equilibrium, volume discharges by focusing the microwave energy into a region of intense energy density. The critical power flux $S_{crit}$ for this type of discharge is extremely high (e.g., from about 0.5 to about 2 MW/cm$^2$, where MW is megawatts). Since microwaves can only be focused to a minimum area on the order of $4\lambda^2$, where $\lambda$ is the wavelength of the radiation, the microwave source must provide a power level $P_{crit}$ that scales as the square of the microwave $\lambda$. Thus:

$$P_{crit}=(2 \rightarrow 8)\lambda^2 MW,$$

where $\lambda$ is in centimeters and MW is megawatts. Hence, for the commercial industrial microwave frequencies of 0.915 GHz ($\lambda$=32.8 cm) and 2.45 GHz ($\lambda$=11.8 cm), the required power densities become unattractive for commercial surface processing applications.

As an alternative to focusing microwave energy in free space, wires or dielectric structures can be used to couple microwave energy in a way suitable to generate a high- or moderate-pressure discharge. A wire "broom" has been used to concentrate 0.36-centimeter microwave energy and produce a non-equilibrium discharge in air.

U.S. Pat. No. 3,814,983 discloses a slow-wave structure using a dielectric structure for the generation of a moderate- to low-pressure microwave discharge. The slow-wave structure is rather complex, and relies on an array of dielectric rods to distribute microwave energy over a large volume. Staggered pairs of dielectric rods are spaced at half-wavelength intervals to couple microwaves from a waveguide and then radiate the coupled energy into a working volume. The half-wavelength spacing of the dielectric rods necessitates single-frequency operation. In order to provide more uniform treatment of a substrate, the dielectric array is physically displaced from the substrate.

U.S. Pat. No. 4,955,035 utilizes a variable-dimension waveguide to generate a high-pressure gas discharge laser. The structure does rely on traveling microwaves and variable-waveguide dimensions to generate a non-equilibrium uniform discharge in a laser volume. The plasma discharge is generated directly by using the electric fields of the traveling wave within the waveguide.

U.S. Pat. No. 5,517,085 discloses a method for generating a moderate- to high-pressure microwave discharge by using an annular waveguide resonator. A waveguide is configured as a closed ring with wall slots cut on the interior wall of the ring. Microwave energy is coupled from an external source into the resonant structure by means of a feed probe. The plasma discharge is generated within the internal volume of the ring via power leaking from the wall slots. The plasma working gas are typically separated from the resonator using a dielectric cylinder. The cylindrical shape of this structure, however, does not lend itself well to the treatment of wide substrates, such as films and webs. Also, the structure is not a traveling-wave structure, but rather a resonant structure.

Slotted waveguides have been used for heating applications and as radiators for antenna structures. Such a slotted waveguide structure has been used for the heating of dielectrics using high-power microwaves. This structure employed multiple slots with the slots typically 0.4$\lambda_0$ in length, where $\lambda_0$ is the free-space wavelength. U.S. Pat. No. 4,334,229 presents a slotted waveguide structure for use as a far-field antenna. This structure utilizes variable waveguide dimensions and slot location to provide a specified radiation pattern. Dielectrics are incorporated with the waveguide for allowing higher power operation, and the weather-proofing of the structure. Both of these structures were neither designed nor intended for the generation of a plasma discharge. Any generation of such a plasma would diminish the utility of these structures as radiators of microwave energy.

SUMMARY OF THE INVENTION

The present invention provides a means for generating a high-power-density microwave discharge having a long length, a narrow width, and a modest volume. The treatment of wide, continuous substrates using a microwave discharge operated at a pressure anywhere from a rough vacuum ($\geq 10$ Torr) to atmospheric pressure becomes feasible using the apparatuses and methods of the present invention. The disclosed apparatus comprises a waveguide structure having a shaped slot machined in the wall of the waveguide. The slot is configured such that a high voltage is generated across the slot when the waveguide is suitably excited with high-power microwaves. The strong electric fields generated in the region of the slot can be used to produce a non-equilibrium plasma discharge in a working gas introduced in the vicinity of the slot. Various substrates can be translated past the slot and exposed to the plasma species generated by the microwave discharge.

The slotted waveguide structure is designed to operate as a traveling-wave structure with microwave energy uniformly dissipated along the length of the slot. Several methods are disclosed for providing uniform power dissipation. These methods include changing the dimensions of the waveguide, altering the position and shape of the wall slot, coupling power into the waveguide using auxiliary sources, and using an auxiliary ground plane. The auxiliary ground plane can also serve as a secondary electrode for the application of a low-frequency voltage for enhancement of high-pressure operation. Altering the background gas pressure, gas composition, gas flow rate, and/or gas flow pattern provides additional means for affecting the plasma discharge. The structure can be designed to operate over the pressure range of about 10 Torr to about 760 Torr using a wide variety of gases and gas mixtures.

The structure of the present invention can be mechanically much simpler than the prior-art slow-wave structure described earlier and can be operated over the bandwidth of the waveguide used. Plasma generation occurs directly in a region of high electric field. Coupling of the microwave energy to the plasma discharge is more localized, direct, and efficient. The strong electric fields needed to generate the plasma are concentrated near the slot gap, rather than in a dielectric source. The waveguide and slot dimensions along with gas flow can be effectively used to control the microwave power transfer to the plasma discharge.

The present invention utilizes electric fields generated across a slot in the wall of a waveguide to generate a plasma. These electric fields are created by the slot interrupting currents in the wall of the waveguide that are induced by the traveling wave within the waveguide.

The slotted waveguide structure of the present disclosure has a number of specific advantages over the prior art for material processing. The slotted structure is useful for the production of long, narrow plasma discharges at moderate to high pressure. This type of discharge is well suited for the treatment of wide substrates such as films and webs. The use of microwave energy in the gigahertz frequency range is significantly more efficient than radio frequency signals in the megahertz and kilohertz range for the generation of ion-electron pairs and higher-order electronic states in a non-equilibrium plasma. These excited species are desirable for surface chemical reactions, and allow surface chemistry to be performed with inexpensive, non-reactive gases such as nitrogen and oxygen.

Moderate- to high-pressure operation of the slotted waveguide structure is desirable for large-volume processing of wide substrates. Rough-vacuum operation in the 50 Torr to 200 Torr range is accessible with relatively simple vacuum pumping and allows the user of nip roller seals for the transport of a web into and out of an enclosure.

The slotted waveguide structure of the present invention is effective at generating a high-pressure discharge due to the intense electric fields generated in the region of the slot. The discharge generated tends to be uniform and well distributed along the length of the slot. Because the structure is operated in a traveling-wave mode, the electric field distribution along the length of the slot does not have the periodic amplitude variation common to cavity mode and standing-wave mode structures. The slotted waveguide design accommodates the plasma's tendency to generate a "short circuit" or low-impedance discharge across the slot by allowing microwaves to continue propagating down the waveguide while still feeding energy to the plasma through the slot.

The waveguide structure can be excited using high-power, low-cost microwave sources and is well suited for operation at the industrially approved heating frequencies of 2.45 GHz and 915 MHZ. The wide use of microwave ovens has made moderate power magnetrons (~1 kW) available as reliable, inexpensive sources. Recent experiments in microwave heating for high-temperature plasma physics experiments and high-energy accelerator projects has pushed the development of high-power klystron sources.

Mechanically, the slotted waveguide structure is relatively easy to fabricate and assemble. With the use of the proper matching techniques, the slotted structure can still operate effectively using inexpensive magnetrons that have poor frequency stability. The use of E-H or E—E tuning stubs at the power inlet section of the slotted waveguide structure can provide effective impedance matching to the microwave source.

In one embodiment, the present invention is a plasma generator, comprising (a) a power supply and (b) a waveguide structure electrically connected to receive electrical power from the power supply and having a slot running along a surface of the waveguide structure. When the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

In another embodiment, the present invention is a method for generating a plasma discharge, comprising the steps of: (a) providing a working gas for a waveguide structure having a slot running along a surface of the waveguide structure; and (b) supplying electrical power from a power supply electrically connected to the waveguide structure, wherein the electrical power (1) propagates along the waveguide structure from a power input end towards a power output end of the waveguide structure in a traveling wave and (2) induces current within the waveguide structure that produces a voltage across the slot sufficient to generate a non-equilibrium plasma discharge in a working gas within a discharge region near the slot.

In preferred implementations, the shape of the waveguide structure and the shape and position of the slot provide a relatively uniform average voltage across the slot along the entire length of the slot.

BRIEF DESCRIPTION OF THE DRAWINGS

Other aspects, features, and advantages of the present invention will become more fully apparent from the following detailed description, the appended claims, and the accompanying drawings in which:

FIG. 9A shows a cross-sectional view of a waveguide structure having a circular cross-section and center conductors 47 and 48 to maintain specific field orientation of the traveling wave;

FIG. 9B shows a cross-sectional view of a waveguide structure having an elliptical cross-section.

DETAILED DESCRIPTION

Figure 1:
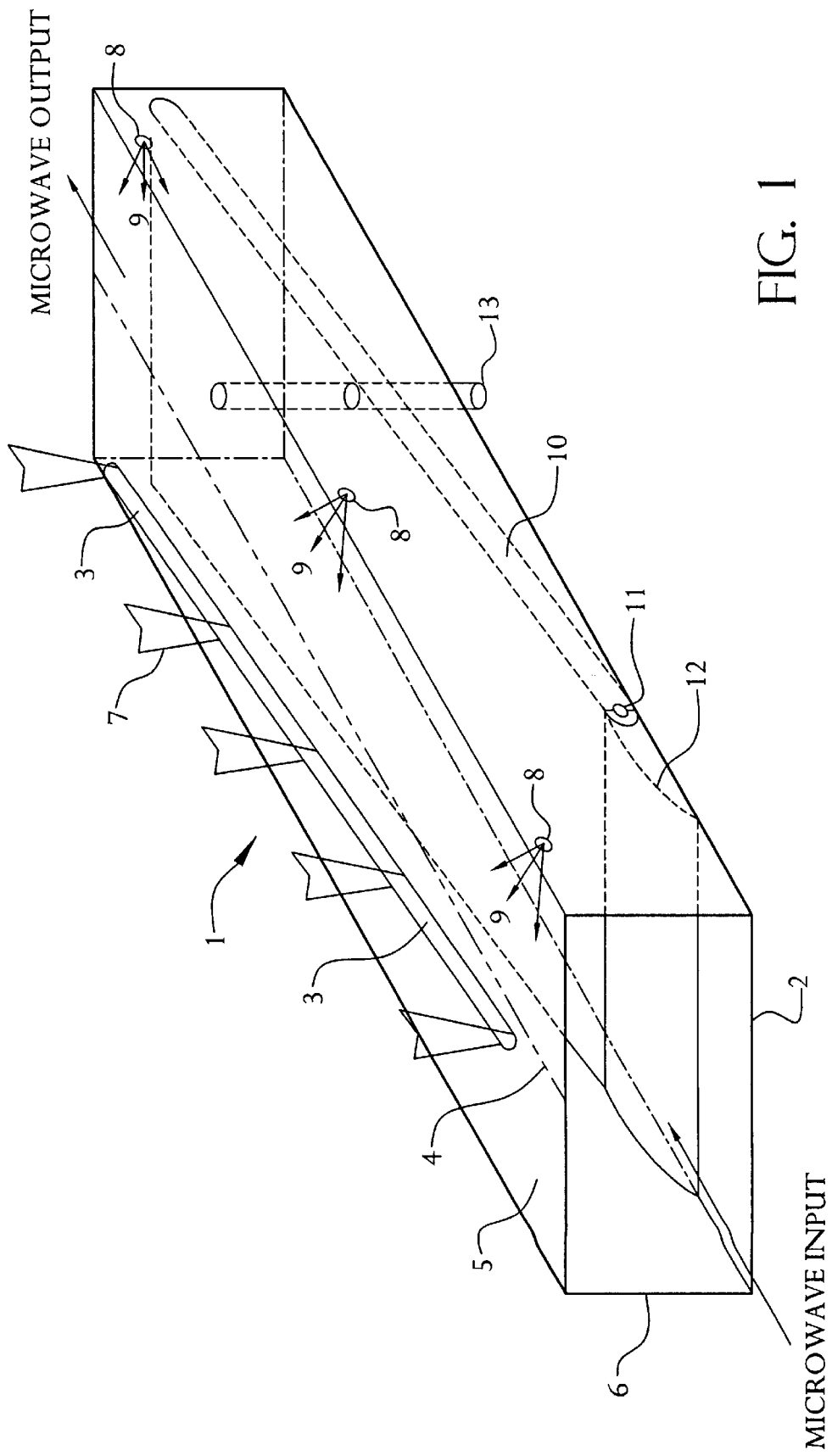
FIG. 1 shows an isometric view of a slotted waveguide structure illustrating a discharge slot in a side wall, a moveable vane, and gas inlets.

FIG. 1 illustrates a slotted waveguide structure 1 comprising a rectangular waveguide 2 having a slot 3 machined through a broad face of the waveguide. As used in this specification, the term "waveguide" refers to a conduit or channel, such as waveguide 1 shown in FIG. 1, having electrically conducting walls, as opposed to a dielectric waveguide such as an optical fiber. Moreover a slot, such as slot 3 shown in FIG. 1, cuts through a wall in the waveguide, as opposed to a mere groove or recess within the wall.

Figure 1A:
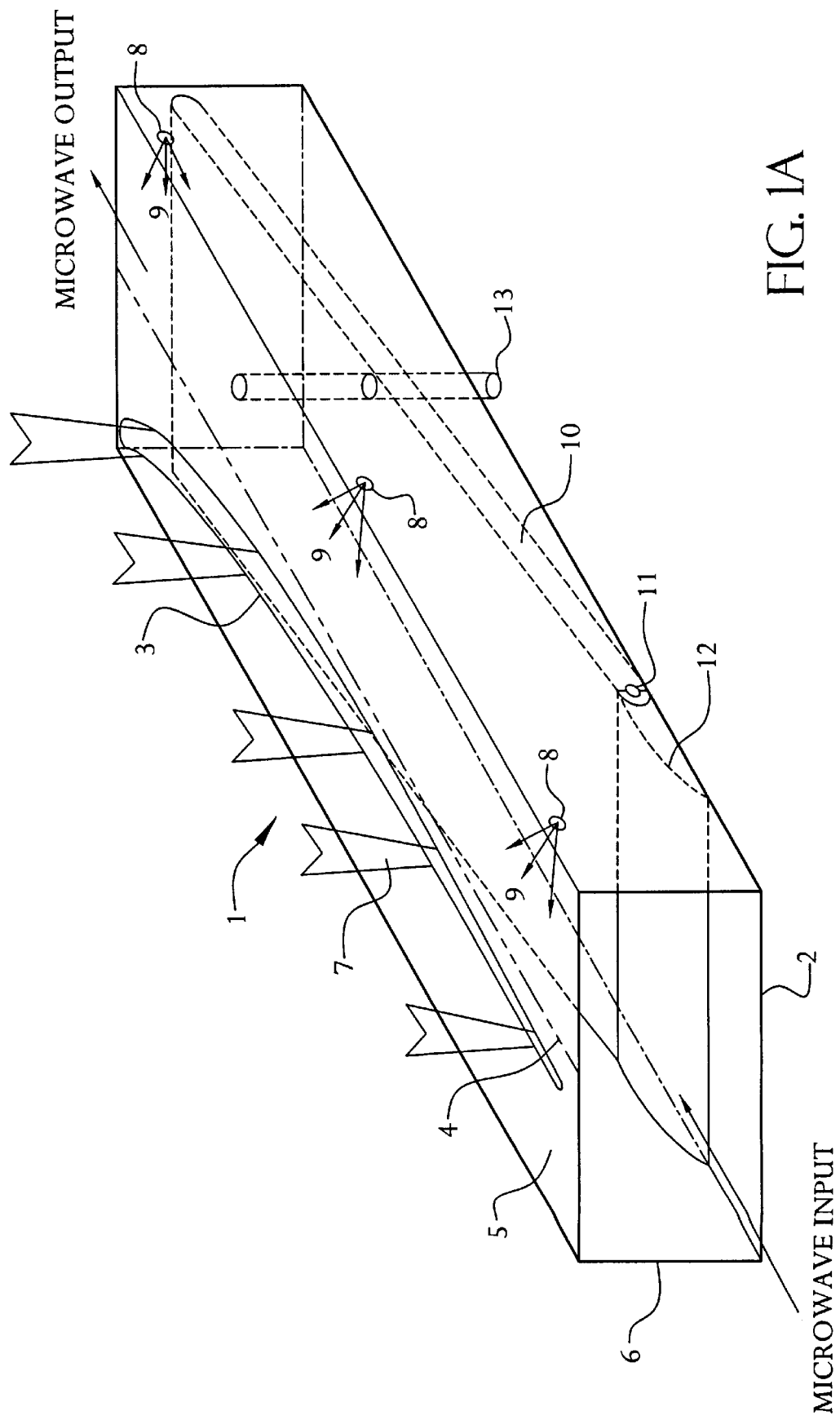
FIG. 1A shows an isometric view of a slotted waveguide structure having a slot whose shape varies along the length of the slot.

Waveguide 2 is configured such that the input microwave power propagates in a fundamental mode, typically the dominant transverse electric ($TE_{10}$) mode. Slot 3 is machined off center of the center line 4 of the broad face 5 of the waveguide. Neither the width (see, e.g., FIG. 1A) nor the position of slot 3 with respect to center line 4 need be constant along the length of slot 3.

In general, the slot width is a function of the power level, operating pressure, gas type, and microwave frequency. In preferred embodiments, the width of the slot is less than 1/10th of the width of the face of the waveguide. Narrower slots allow higher operating pressures, whereas wider slots can be used with inert gases such as helium or argon due to their discharge properties.

For a rectangular waveguide operated in the fundamental $TE_{10}$ mode, slot 3 is preferably machined so that its length angles away from the wall center line 4 and toward the narrow face 6 of the waveguide. If angled, slot 3 will be closest to center line 4 at the power input end of waveguide 2. Slot 3 then angles toward side wall 6 while moving along the waveguide in the direction of decreasing microwave power. By progressively moving away from center line 4, slot 3 continues to interrupt a greater portion of the wall currents induced by the traveling wave of the input microwave power. This allows a constant or nearly constant voltage to be generated across slot 3.

With sufficient input power, a plasma discharge will be ignited in the vicinity of the slot 3 and convect outward as a plasma plume 7. Input microwave energy will then be coupled to plasma discharge 7, while under proper operating conditions will be distributed along the length of slot 3. With proper design and operating conditions, the structure operates in a traveling-wave mode. Slot 3 can be greater than $\lambda_g/2$ in length, where $\lambda_g$ is the waveguide wavelength of the source microwave energy, and discharge 7 will be distributed uniformly or nearly uniformly along the length of slot 3.

Gas inlets 8 can be positioned along the length of a side wall to provide a continuous supply of a working gas 9. A sequence of small inlet holes 8, distributed along a side wall 6, allows the flow of a supply gas 9 to influence and control the behavior of the plasma discharge 7. Higher flow rates provide a means for convecting significant amounts of plasma species beyond the wall slot 3. Ports 8 should not be sufficiently large to interfere with the wall currents induced in the sidewalls of waveguide 2. Gas flow ports 8 can also be machined inside side wall 5 so that a working gas can be introduced directly into slot 3. The rate of gas flow through the supply ports is preferably adjusted so that the net flow out of the slot is in the range of 1 to 2 liters/(centimeter-minute). For uniformly spaced supply ports, the flow should be equally divided so that as uniform as possible a flow will exist along the slot. Depending on the type of gas used, the range in flow rates may expand to 0.2 to 10 liters/(centimeter-minute). A dielectric structure, which is discussed later, can also be effectively used to direct the flow of supply gas 9 to the vicinity of slot 3.

An additional means of improving the uniformity of power distribution along slot 3 is to position a moveable vane 10 with waveguide 2. Vane 10 is machined to fit snugly against the side walls of waveguide 2 and form an inner conducting wall opposite slot 3. It is important that good electrical contact be maintained between vane 10, which made of a good electrical conductor or plated with a good electrical conductor such as copper or gold, and the walls of waveguide 2 so that currents induced in the walls of waveguide 2 and vane 10 are not interrupted. The vane and waveguide are preferably machined to have a sliding contact between the edge of the vane and the side wall of the waveguide or the vane is fitted with metal wipers to provide good electrical contact between the vane and the wall. Any gap between the vane edge and the waveguide wall will capacitively couple the vane and the wall, which may result in arcing or a discharge during high-power and/or low-pressure operations.

Vane 10 is pivoted about point 11, so that the cross section of waveguide 2, can be varied along its length. By positioning vane 10 so that the cross section of waveguide 2 decreases in the direction of decreasing microwave power, the electric field within the narrowed region of waveguide 2 can be maintained more constant. Currents induced in broad face 5 will therefore be maintained more constant despite the decreasing power flux along waveguide 2 and a more constant voltage gradient will exist across slot 3.

The pivoting end 11 of vane 10 is carefully connected to the adjoining wall of enclosing waveguide 2 by a flexible strip 12, which should be made of a conductive material like or similar to the vane or the walls of the waveguide. Strip 12 provides a smooth gradient of the boundary conditions for the input microwaves and good electrical continuity of vane 10 to waveguide 2. Strip 12 could be made as a form-fitting wedge or plug to provide a smooth transition from the waveguide wall to the pivot of vane 10. The movement of vane 10 can be facilitated by an actuator screw 13 which passes through the wall of waveguide 2, and connects to a suitable external means of rotation (not shown).

Vane 10 like slot 3 does not have to be straight, but can be curved so that the cross section of waveguide 2 will vary non-linearly along its length. Once designed for a specified operating range, structure 1 can be constructed so that vane 10 is fixed and becomes the outer wall of waveguide 2.

Figure 2:
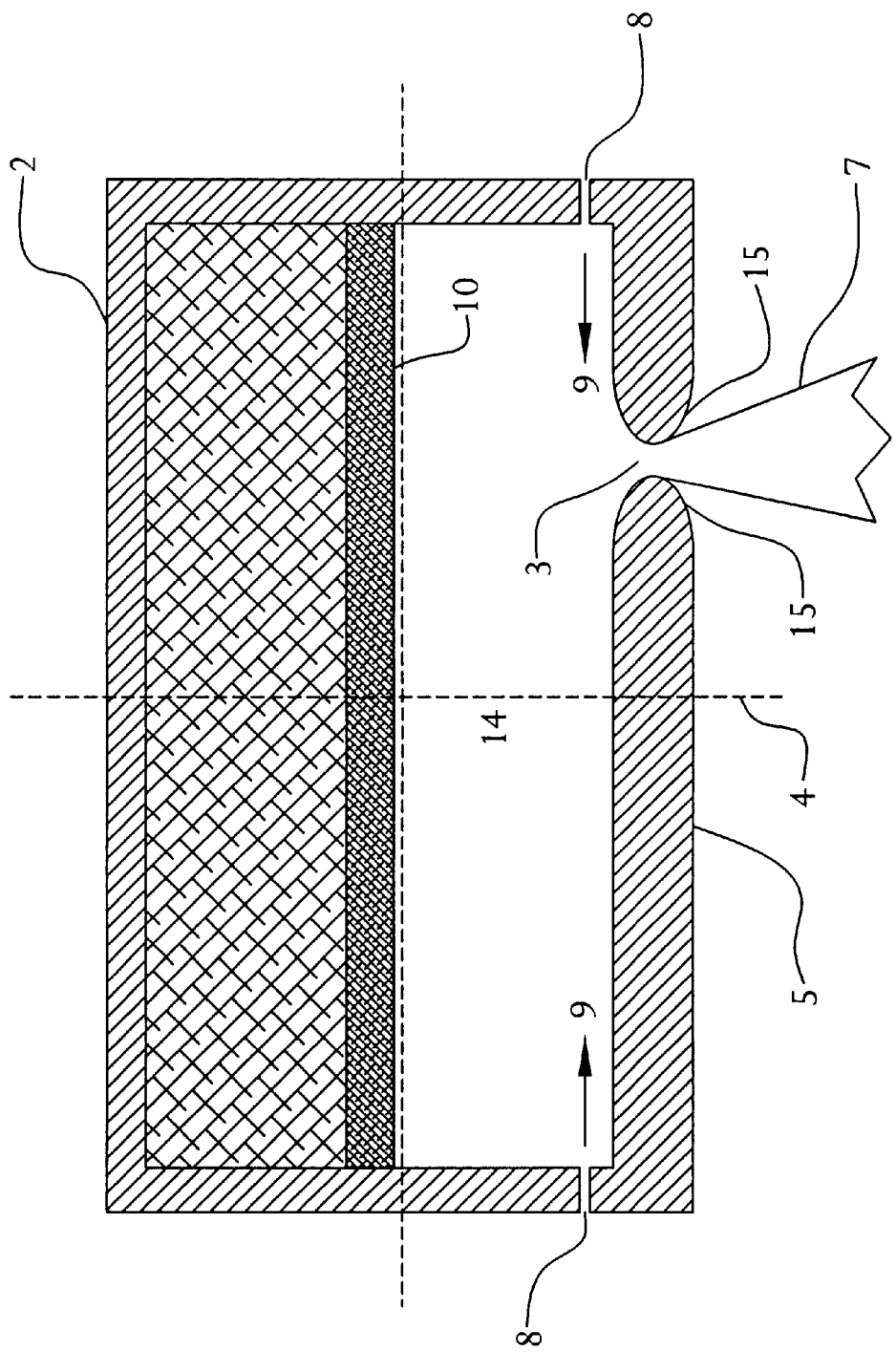
FIG. 2 shows a cross-sectional view of a slotted waveguide with contoured slot edges, vane, and gas inlets.

FIG. 2 illustrates a particular cross section of the slotted waveguide structure 1 of FIG. 1 looking toward the input end of the waveguide. At this location, vane 10 is positioned almost midway in waveguide 2 so that the cross sectional area 14 of waveguide 2 energized by microwave energy is just over one half the total cross sectional area of waveguide 2. This contour can be approximately elliptic so as to provide a more controlled electric field distribution within gap 3. The edge faces 15 of slot 3 can also be covered with a dielectric coating such as aluminum oxide or zirconium oxide. This type of coating can improve high-pressure operation by reducing excessive field or thermionic emission which can give rise to a filamentary discharge or arcs.

Figure 3:
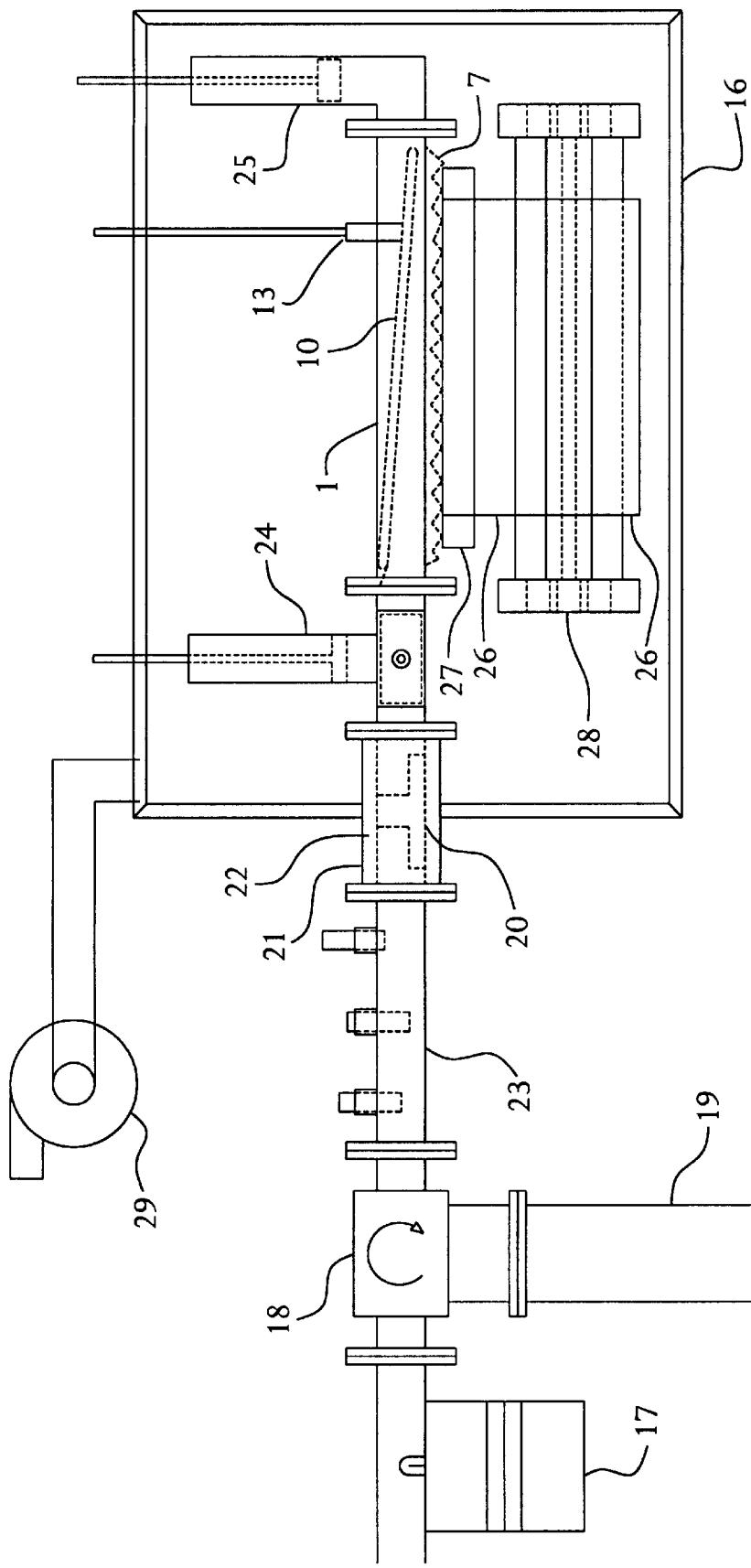
FIG. 3 shows a slotted waveguide structure configured within an enclosure and connected to support components.

In order for slotted waveguide structure to be used as a plasma discharge applicator, the structure is configured with additional support hardware. FIG. 3 illustrates a typical configuration with the slotted waveguide 1 configured as an applicator inside a process enclosure 16, and coupled to an external microwave source, i.e., magnetron 17. Circulator 18 protects magnetron 17 from excessive reflections that may occur due to waveguide impedance mismatches. Any power that is reflected back to source 17 is channeled into and dissipated by waveguide load 19.

Window 20 is a dielectric structure positioned within a connecting waveguide 21, and acts as a barrier to allow a gas and/or pressure differential to be maintained across connecting waveguide 21. Connecting waveguide 21 can be fitted with a coolant jacket 22 to provide cooling of the interior wall of waveguide 21 and therefore cooling of the waveguide window 20. Triple-stub matching network 23 and E-H tuner 24 provide means for matching the impedance of window 20 and slotted waveguide 1 to the microwave source 17 for maximum power transfer to the plasma discharge 7.

The output end of applicator 1 can be terminated by a number of methods. Slotted waveguide applicator 1 can be terminated by means of a sliding short 25 or by use of a waveguide load (not shown) similar to load 19. Sliding short 25 is basically a section of waveguide fitted with a metal plug or block that will slide within the waveguide. The plug is form-fitting and/or fitted with metal wipers so that good electrical contact is maintained as the plug is moved within the waveguide.

With proper tuning of the E-H tuner 24, a fixed short located only a few centimeters from the end of slot 3 in applicator 1 was also found to work adequately. With proper design and tuning, applicator 1 operates predominately in a traveling wave mode with very little power reflected to source 17. Once plasma 7 is initiated, the slotted waveguide is a very "lossy" structure, and any reflected power from a short 25 will quickly be dissipated in the ignited plasma 7 along the length of applicator 1.

Slotted waveguide 1 can be oriented so that a web or film substrate 6 can be translated past the slotted face of applicator 1 and exposed to the plasma species generated by plasma discharge 7. A guide roller 27 is used to facilitate the movement of substrate 26 past applicator 1. A set of nip rollers 28 can be used to provide an interface for substrate 26 to enter and exit enclosure 16. Pump 29 is used to vent enclosure 16 or evacuate enclosure 16 down to a rough vacuum and maintain enclosure 16 at a pressure from about 10 Torr to just below atmospheric pressure (~760 Torr).

As mentioned earlier, dielectric window 20 of FIG. 3 serves the important function of isolating microwave source 17 from the working gas and plasma discharge 8 of the slotted waveguide 1. If the microwave-generated plasma is to be used at pressure below atmospheric, most microwave sources must be isolated from the plasma discharge region of structure 1. The output of most high-power microwave tubes is generally designed to work at atmospheric pressure or above so that a discharge does not occur at the microwave feed. In order to isolate the microwave source from the desired region of gaseous discharge, the dielectric window 20 is positioned within connecting waveguide 21. This window serves as a pressure and/or gas barrier between the plasma discharge 7 and microwave source 17.

Figure 4:
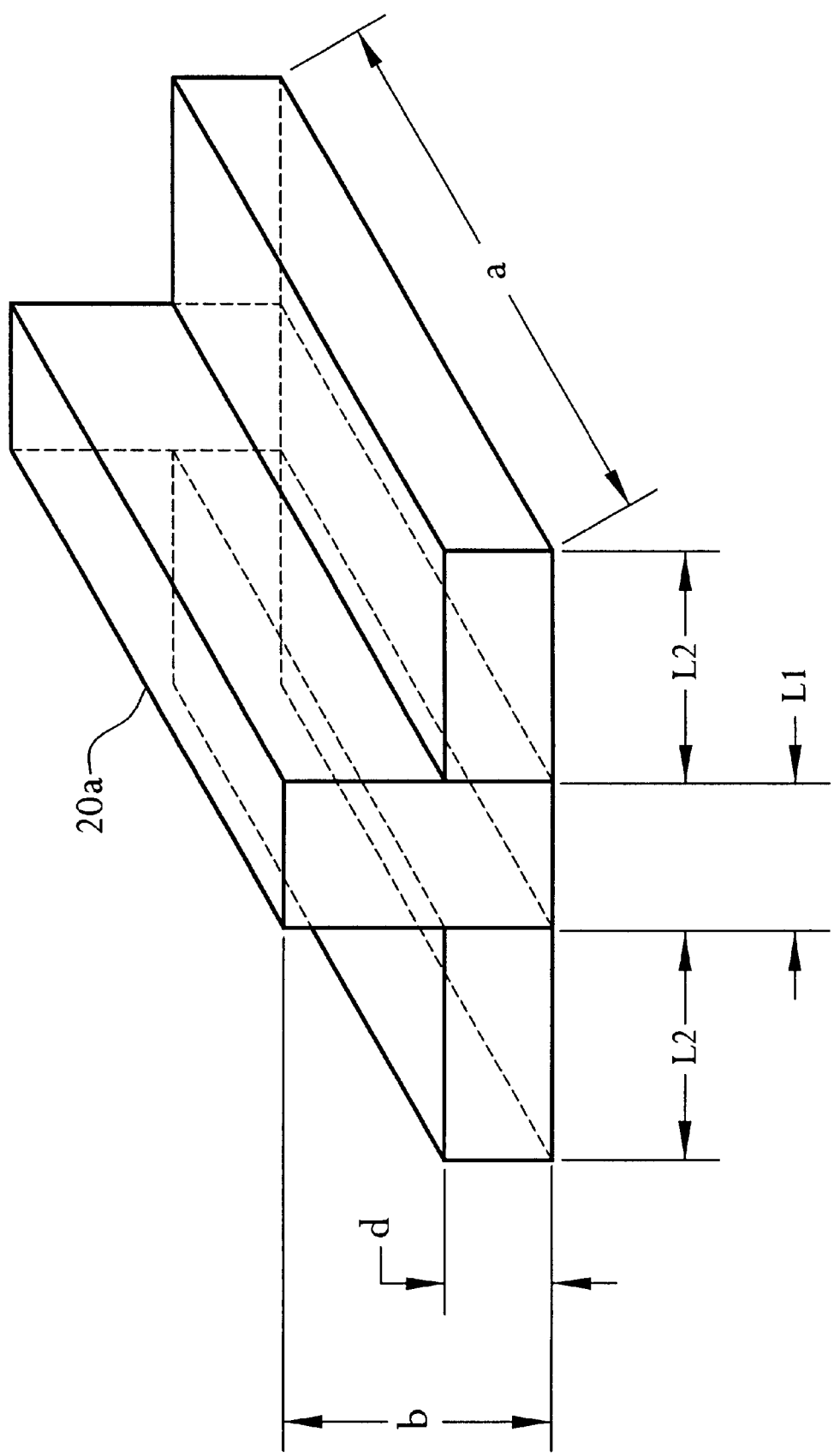
FIG. 4 shows an isometric view of a dielectric window structure having a simple block shape.
Figure 5:
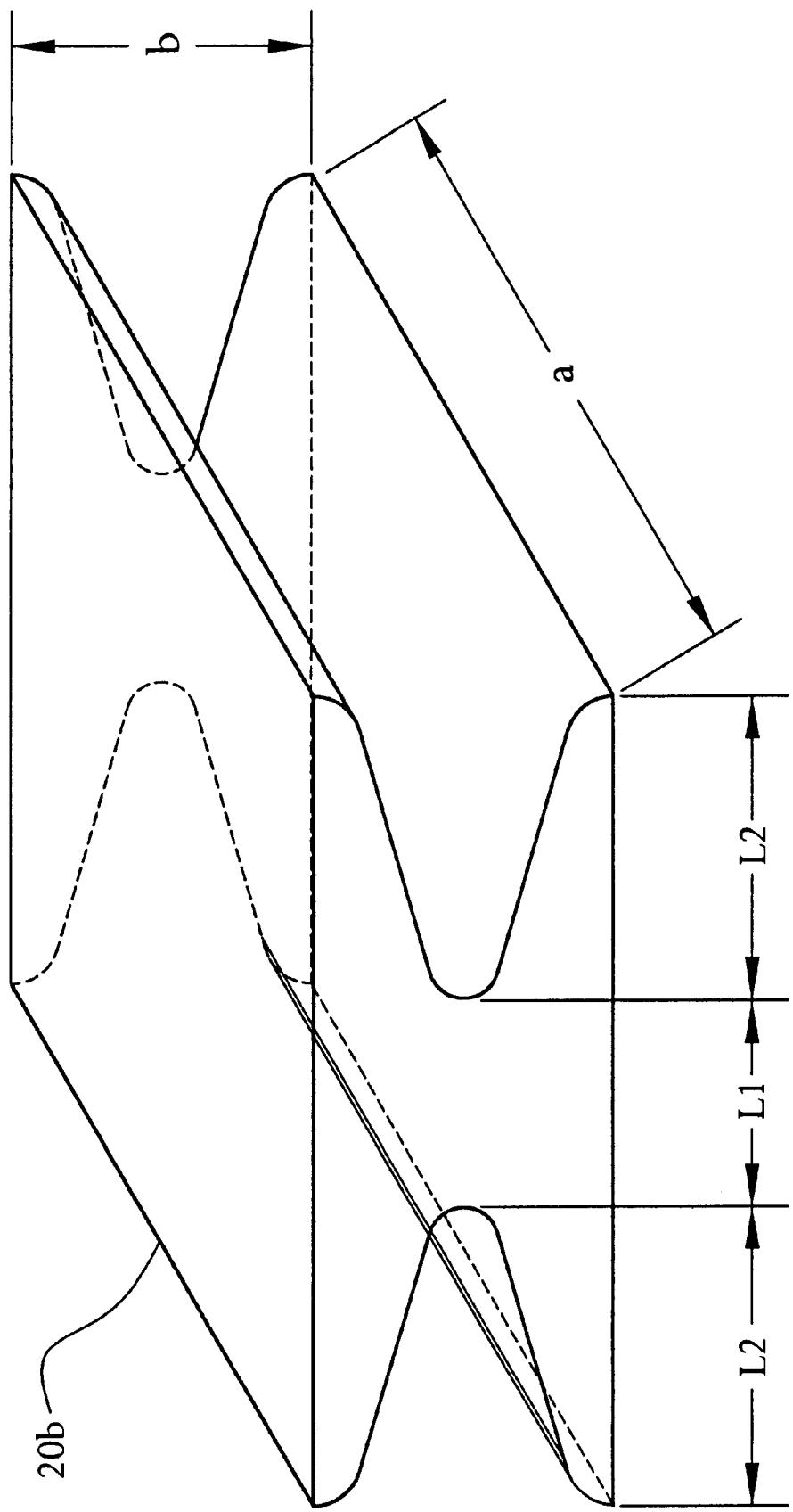
FIG. 5 shows an isometric view of a dielectric window structure having machined geometry with gradual transitions.

Two dielectric materials of choice for window structures are quartz glass and Teflon polymer, due to their transparency to microwaves, moderate dielectric constant, and low dissipation properties. Other potentially suitable materials include polystyrene, ruby mica, and certain low-loss grades of polyethylene. FIGS. 4 and 5 illustrate two particular designs of the dielectric window that can be inserted within waveguide 21. FIG. 4 illustrates a window design 20a that can be fabricated as a single block or as three separate blocks. The dimensions for this type of dielectric window are L1=0.25$\lambda_{ga}$ and L2=0.25$(\lambda_{ga}\lambda_{gd})^{1/2}$, where $\lambda_{ga}$ is the guide wavelength in air and $\lambda_{gd}$ is the guide wavelength in the dielectric. In general, the waveguide wavelength for the dominant TE$_{10}$ mode is a rectangular waveguide of dimensions (a,b) is given by:

$$\lambda_g = \lambda(\epsilon - (\lambda/\lambda_c)^2)^{-1/2}$$

where $\lambda$ is the free-space wavelength and $\lambda_c$=(2a) is the cut-off wavelength of the waveguide, and $\epsilon$ is the relative dielectric constant of the air or dielectric.

At high powers, the discontinuities introduced by the faces of the block gives rise to strong localized electric fields. These fields can result in excessive heating of the dielectric block and cement, or even a plasma discharge. Any plasma discharge on or near the window face will inhibit microwave power transfer to the downstream side of the window and potentially damage the dielectric window. Ikeda et al., "Discharge at the pillbox window for an LHRF launcher," IEEE Trans. Plas. Sci. 17,534 (1989), discuss methods for conditioning or treating the face of a dielectric window and surrounding waveguide to minimize the possibility of a plasma discharge. These methods focus on the reduction of secondary electrons that can be emitted from a dielectric or metal surface. In addition to surface conditioning, a gas flow can be introduced across the face of a window to quench or delay the formation of a plasma discharge on the window face. Since significant heating of any dielectric window can occur at high power levels, gas flow and cooling of the waveguide wall in the vicinity of a window can be used to provide cooling of the dielectric window.

FIG. 5 illustrates an alternative design 20b to the design of FIG. 4 using a solid machinable dielectric such as Teflon. This structure has the advantage of being machined into a shape that allows a more gradual transition of the microwave electric field. The use of two sloping transition sections also improves the heat transfer from the dielectric window to the cooled sidewall of an enclosing waveguide.

Figure 6:
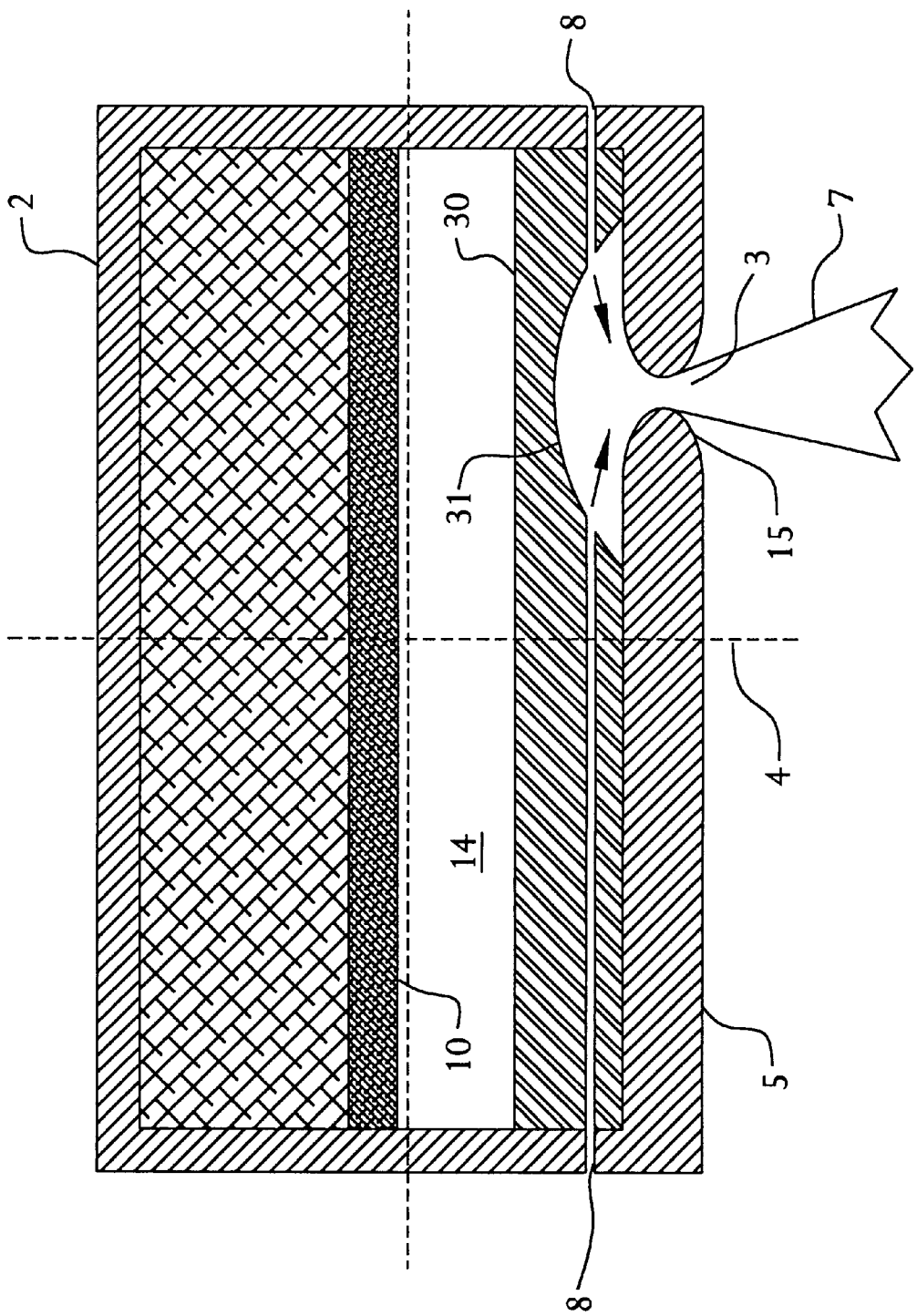
FIG. 6 shows a cross-sectional view of a slotted waveguide having an internal dielectric covering with gas flow passages.

An alternative to the dielectric window designs illustrated in FIGS. 4 and 5, is to position a dielectric within the slotted waveguide 1 and directly over waveguide slot 3. FIG. 6 illustrates a cross section of the slotted waveguide 1 with a dielectric window 30 that partially fills waveguide 2 and is positioned directly over the wall slot 3. This configuration allows the discharge region of slot 3 to be isolated from the rest of the waveguide 2 and a gas and/or pressure differential exist between the inside and outside of waveguide 2. The dielectric 30 can be machined with a radius 31 so that the dielectric 30 is not in contact with the discharge. In addition, the dielectric can be machined with gas passages 8 so that a supply gas can be introduced directly into the discharge region of slot 3. This configuration also allows the enclosed volume of waveguide 2 and supporting hardware to be slightly pressurized with a discharge-suppressing gas such as sulfur hexafluoride. Waveguide 2 can then be energized with a higher microwave power density without an unwanted plasma discharge occurring in region 14 of waveguide 2. If the integrity of the dielectric covering 30 is compromised by plasma species or ultraviolet radiation from the discharge 7, a ceramic coating can be applied to the inner radius 31 to form a composite structure having an improved resistance to the plasma species.

Figure 6A:
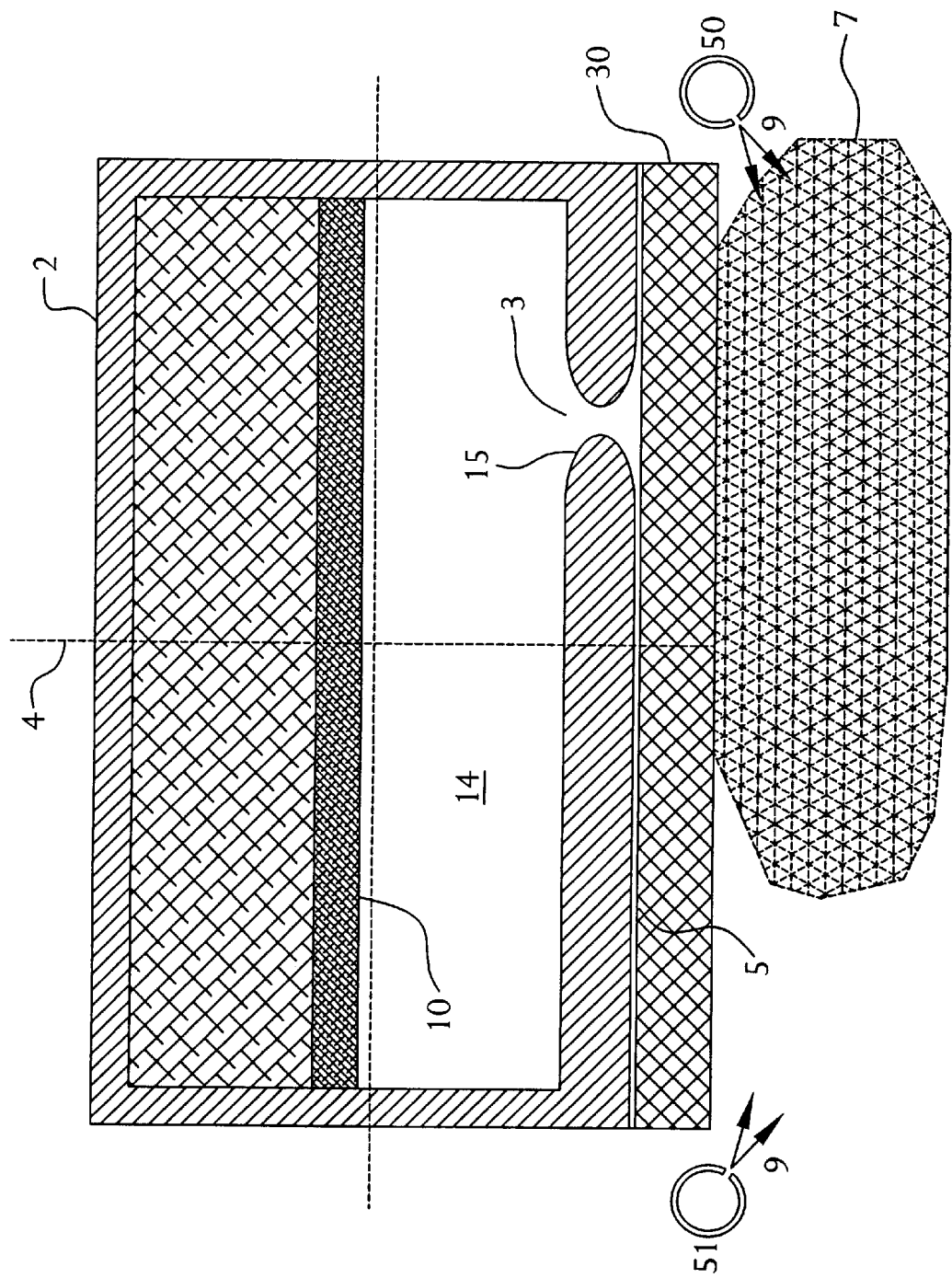
FIG. 6a shows a cross-sectional view of a slotted waveguide having an external dielectric window mounted to the outside of the slotted side of the waveguide.

FIG. 6a shows an alternative to FIG. 6, in which a dielectric window 30 is mounted on the outside of the slotted side of the waveguide 2. For this configuration, manifolds 50 and 51 are used to introduce a working gas into the discharge region 7, which occurs on the outer face of the window 30. The window 30 can be sealed to the waveguide 2 using a suitable adhesive such as a high-grade epoxy.

The slotted waveguide technique of the present invention can be implemented using different embodiments, some of which are described below.

Figure 7:
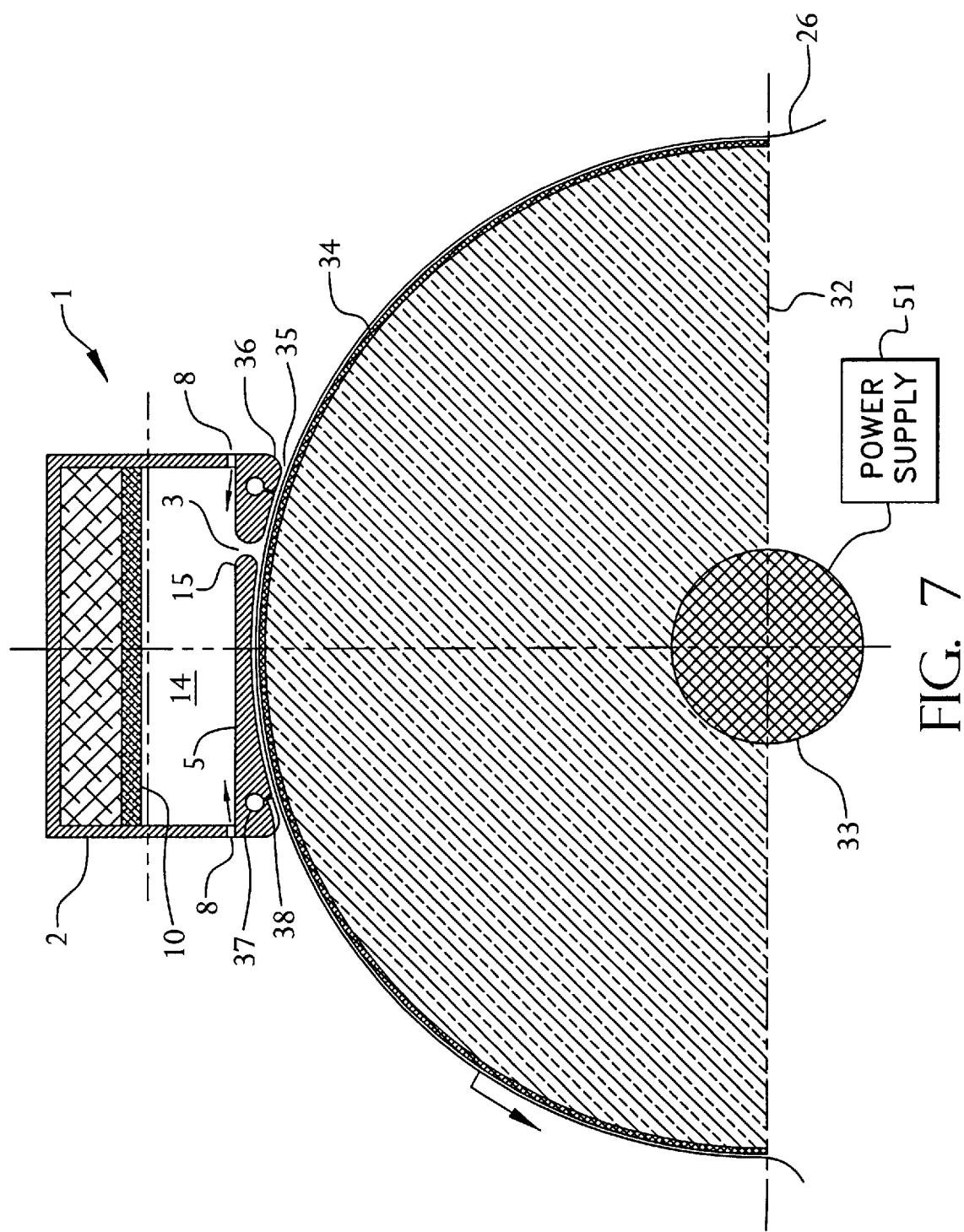
FIG. 7 shows a cross-sectional view of a slotted waveguide structure having a contoured broad face for use with a cylindrically shaped substrate support or secondary electrode.

When treatment of a substrate is external to the waveguide, a secondary support is often used to position a substrate in the vicinity of the plasma discharge. FIG. 7 illustrates a cross-sectional view of waveguide applicator 1 positioned parallel to and next to a treater drum 32. Treater drum 32 is made so that is can rotate on a support shaft 33 and allow substrate 26 to be translated past the discharge of waveguide applicator 1. The outer surface of the slotted wall 5 can be contoured so that a uniform gap 35 is formed between the outer diameter of drum 32 and the outer face of side wall 5. Due to the ability of the waveguide structure to produce a plasma plume of up to a few centimeters in length, the gap between waveguide 2 and treater drum 32 can be varied from a few millimeters to several centimeters, with the particular spacing being a function of the gas and operating pressure as well as the overall geometry.

By electrically isolating treater drum 32 from waveguide 2, drum 32 can serve as a secondary electrode in addition to serving as a support for substrate 26. By coating either the secondary electrode (i.e., drum 32) or the slot 3 and slotted wall 5 of waveguide 2 with a suitable dielectric, a low-frequency pulsed voltage or sinusoidal RF voltage can then be applied to treater drum 32 (e.g., by power supply 51) or waveguide 2 to form a dielectric barrier discharge within gap 35. This discharge will augment the microwave discharger 7 for improved high-pressure operation. At atmospheric pressure, either (1) a low-frequency RF voltage in the range of 1 kHz to 100 kHz with an amplitude of several kilovolts or (2) a pulsed voltage having a rise time of typically one microsecond or less, three kilovolts amplitude or more, and a repetition rate of 1 kHz to 100 kHz can be used, with essentially any gas for the low-frequency discharge. If the waveguide applicator 1 is operated at a reduced pressure of approximately 200 Torr or less, a higher frequency RF signal in the range of 0.5 MHZ to 30 MHZ can be used in conjunction with the microwave-excited discharge 7.

In addition to exiting through the slot gap 3, a working gas can be introduced into the annular gap 35 by means of flow conduits 37 and passages 38. The dielectric coating 34 reduces the potential for arcing due to local thermionic emission or excessive field emissions. For the ionization of particularly difficult gases, the microwaves can be pulsed in conjunction with the low-frequency signal. After a discharge is first ignited with the low-frequency signal, the pulsed microwave signal is applied and strongly absorbed by the initial plasma.

The treater drum 32, whether or not electrically excited with a low-frequency signal, will serve as a ground plane for the high-frequency microwave signal. The treater drum 32, waveguide wall 5, and waveguide slot 3 should each be properly contoured for the strong electric fields present by both the microwave and low-frequency signals. The edges of waveguide 2 can be contoured 36 with approximately an elliptic shape to provide smoother electric field gradients between drum 32 and waveguide 2.

Figure 8:
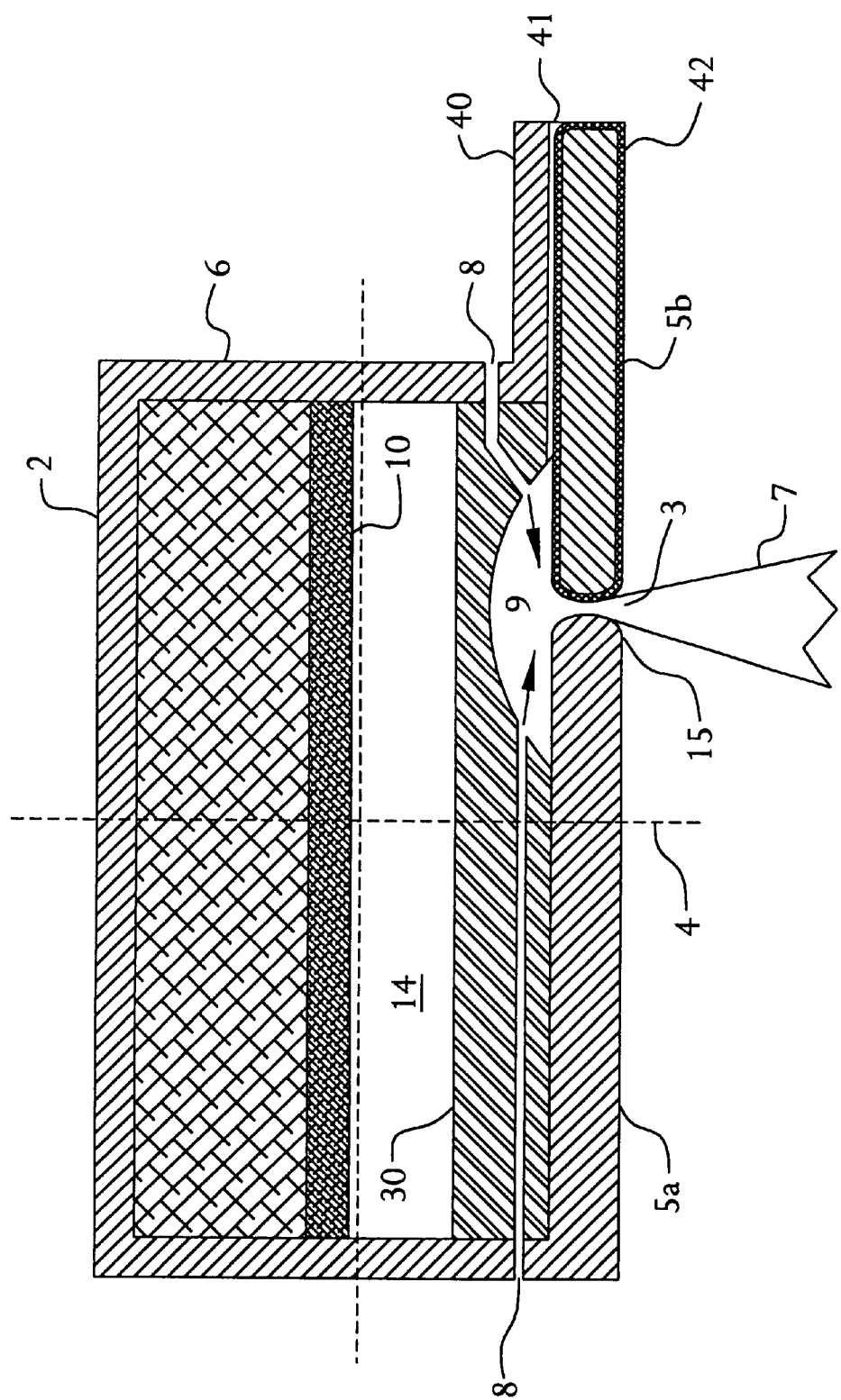
FIG. 8 shows a cross-sectional view of a rectangular slotted waveguide having a modified side wall to allow additional low-frequency excitation across the slot gap.

An alternative method to combining and RF signal or pulsed signal with the microwave signal, is to modify a side wall of the slotted waveguide as illustrated in FIG. 8. Side wall 6 is modified to have the extension 40, which allows the broad face wall 5 to be formed in two portions 5a and 5b. By introducing a mechanical gap 40 between section 5b and wall extension 40, section 5b will become capacitively coupled to side wall 6. Gap 41 can be filled with a thin high-voltage dielectric, and section 5b can be coated with a dielectric coating 42 so that an electrical discharge will not occur within gap 41. Dielectric coating 42, which may be plasma- or flame-sprayed onto the metal substrate, can be comprised of, for example, either an aluminum oxide or zirconium oxide base. Thicknesses typically range from 0.5 mm to 1.0 mm for this type of coating. Gap 41 is preferably maintained as small as possible within the limits of the dielectric strength of the dielectric material placed within gap 41. This dielectric material should be able to withstand the applied high-voltage RF or pulsed signal. The use of a ceramic coating 42 and a high dielectric strength material such as Mylar, allows gap 41 to be 1 mm or less.

By varying the dimensions of wall extension 40 and wall section 5b, the degree of capacitive coupling between extension 41 and section 5b can be varied. This gap capacitance can be such that for the high-frequency microwaves within waveguide 2, a low impedance exists between wall extension 40 and wall section 5b, whereas for the RF signal or pulsed signal, a high impedance exists across gap 41. With extension 40 and section 5b isolated in this manner, an RF voltage or pulsed voltage similar in manner to that applied with the configuration in FIG. 7 can be used to augment the microwave discharge 7. Since a low impedance exists between extension 40 and section 5b for the high-frequency microwaves, the wall slot 3 will behave essentially the same for the microwave currents induced in the walls of waveguide 2. With this configuration, high-pressure operation of the slotted waveguide structure is augmented by a low-frequency discharge without the need for an external electrode, such as treater drum 32 in FIG. 7.

Figure 9:
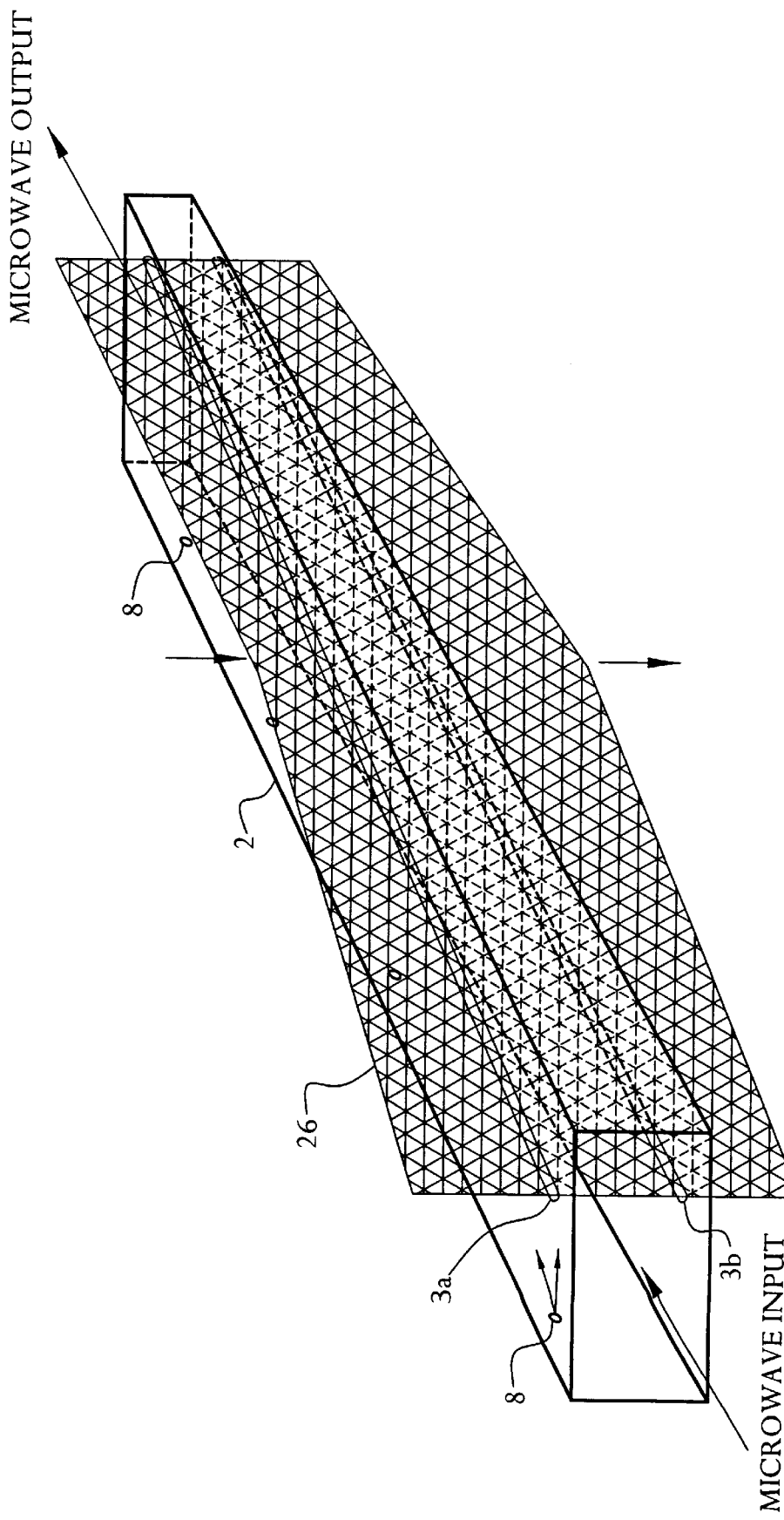
FIG. 9 shows an isometric view of a modified rectangular waveguide structure having two slots for through treatment or two-sided treatment of a thin substrate.

FIG. 9 illustrates a modified version of the slotted waveguide structure illustrated in FIG. 1 for the simultaneous treatment of both sides of a thin substrate. Waveguide 2 is fabricated with a predetermined taper and having wall slots 3a and 3b, machined in both the upper and lower broad side walls of the waveguide. These slots are aligned in such a way as to allow a thin substrate to be continuously transported through waveguide 2. The wall slots 3a and 3b are offset from the center of each broad face and can be angled outward toward the narrow side wall. These slots should be straight however, so as to allow a substrate 26 to be passed through the waveguide 2 with minimum contact on the edge faces of slots 3a and 3b. The edges of slots 3a and 3b can be contoured in a manner similar to that discussed for the arrangement in FIG. 2 so as to provide a more uniform discharge within the slots. Gas ports 8 can also be utilized to introduce a working gas into the waveguide 2, which will in turn flow outward through the wall slots 3a and 3b. The tapered waveguide can be configured with support hardware in a manner similar to that illustrated for the applicator 1 in FIG. 3.

The embodiments described above are directed to a slotted waveguide structure having a rectangular cross-section. However, waveguides having cross-sections other than rectangular can also be used. These include circular waveguides having center conductors to maintain specific field orientations (see, e.g., FIG. 9A) or elliptical waveguides with or without such center conductors (see, e.g., FIG. 9B), as well as ridge-loaded waveguides. Ridge-loaded or ridged waveguides can be operated in a transverse electromagnetic (TEM) mode as well as the transverse electric (TE) modes. This allows a ridged waveguide to operate over a broad bandwidth as well as providing the means for igniting a plasma within the waveguide.

Figure 10:
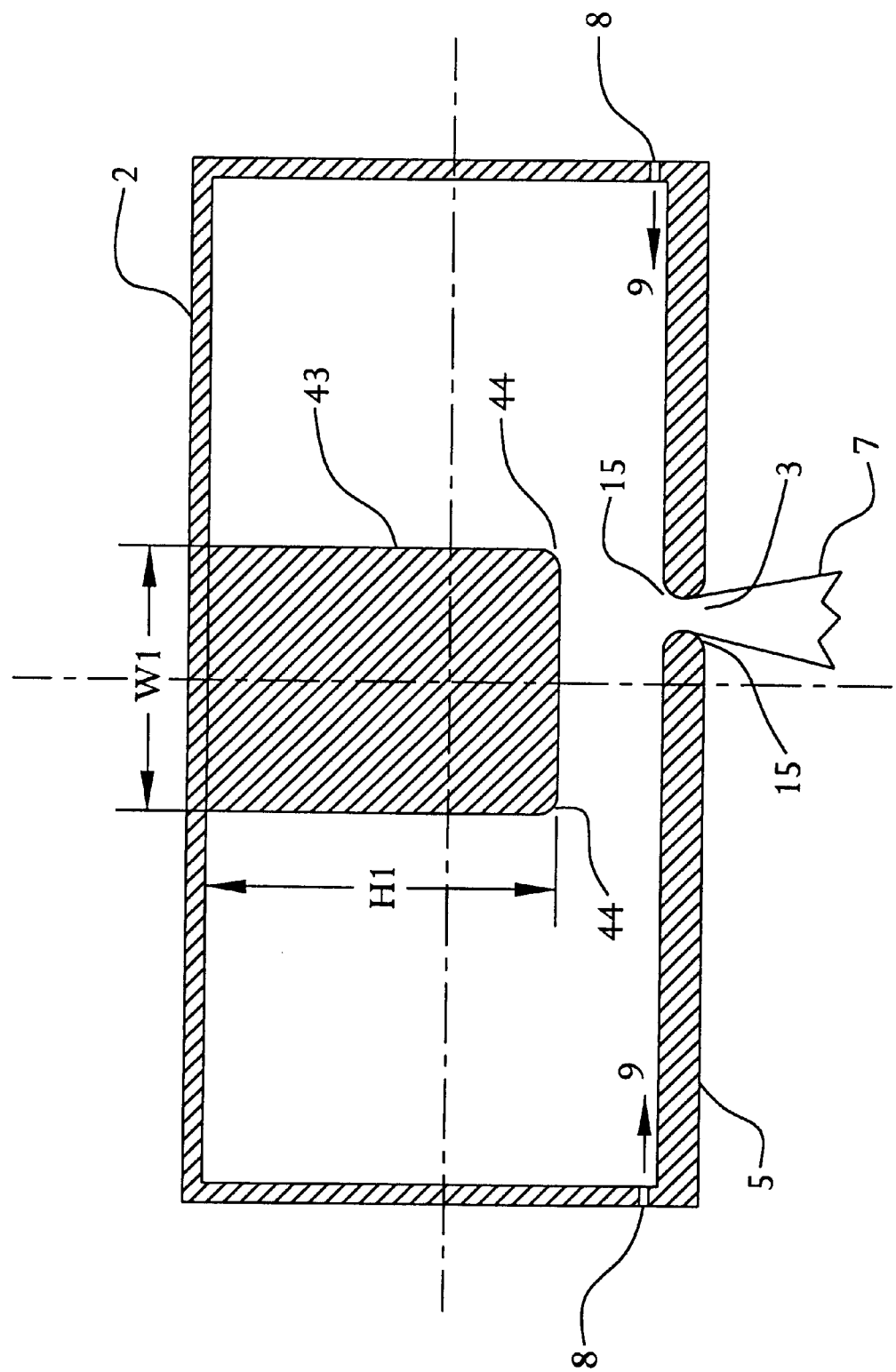
FIG. 10 shows a ridge-loaded waveguide structure having single wall slot.
Figure 10A:
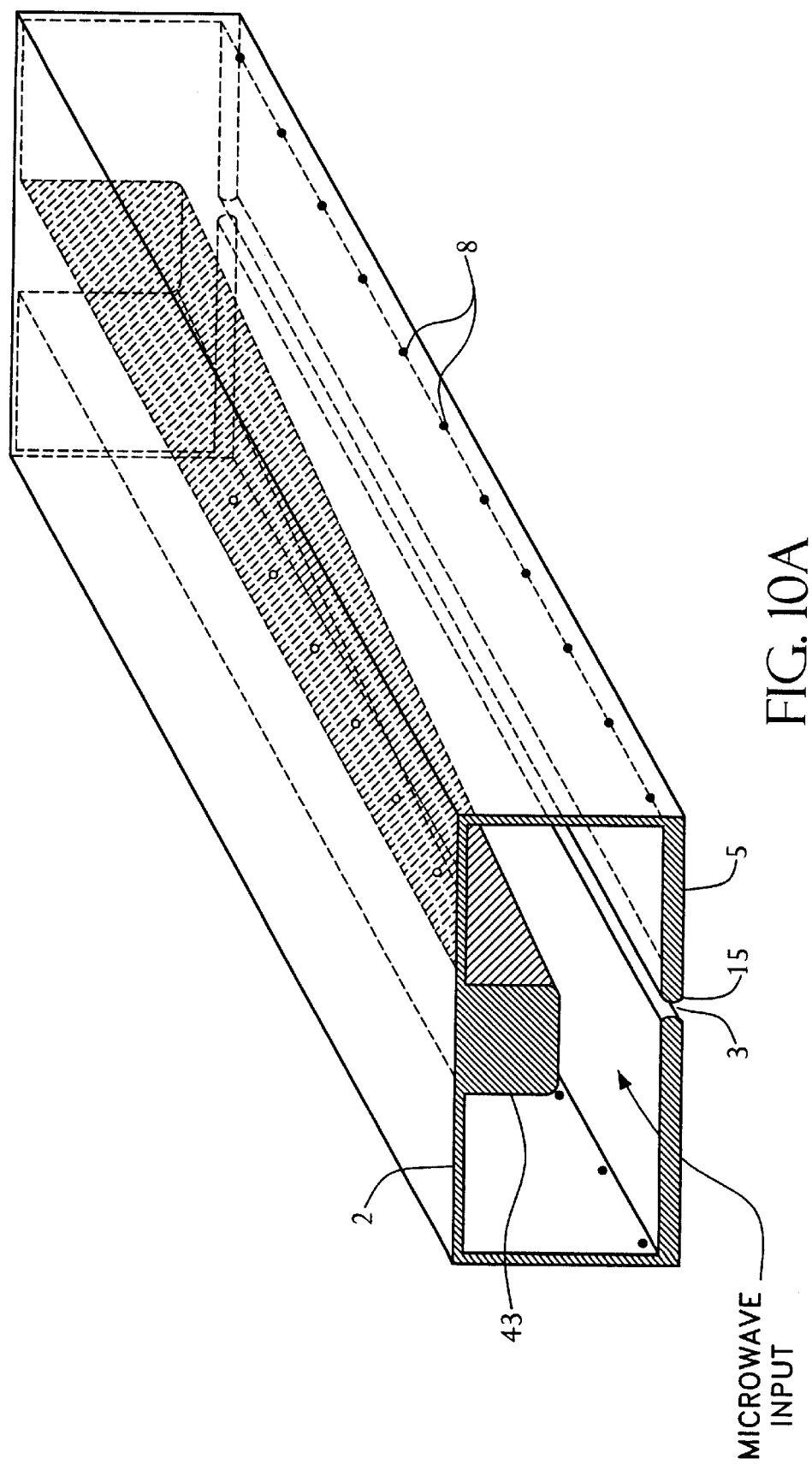
FIG. 10A shows an isometric view of a waveguide structure having a ridge 43 whose cross-section varies along the length of the waveguide structure.

FIG. 10 illustrates an alternative embodiment with a waveguide 2 internally loaded with a ridge structure 43. The height H1 and width W1 of ridge 43 can be varied (e.g., along the waveguide structure as in FIG. 10A) to not only change the bandwidth of the structure, but also the intensity of the electric fields generated across the wall slot 3. The edge faces 15 of slot 3 as well as the edges 44 of ridge 43 should be contoured in a manner similar to that mentioned previously. A working gas can be introduced into the guide so that it flows out through slot 3 where the plasma discharge 7 is produced when waveguide 2 is suitably energized with microwave energy. A variety of methods exist for launching the microwave signal within the ridge-loaded waveguide 2. A substrate to be plasma treated would be translated past or through the plasma discharge 7.

Figure 11:
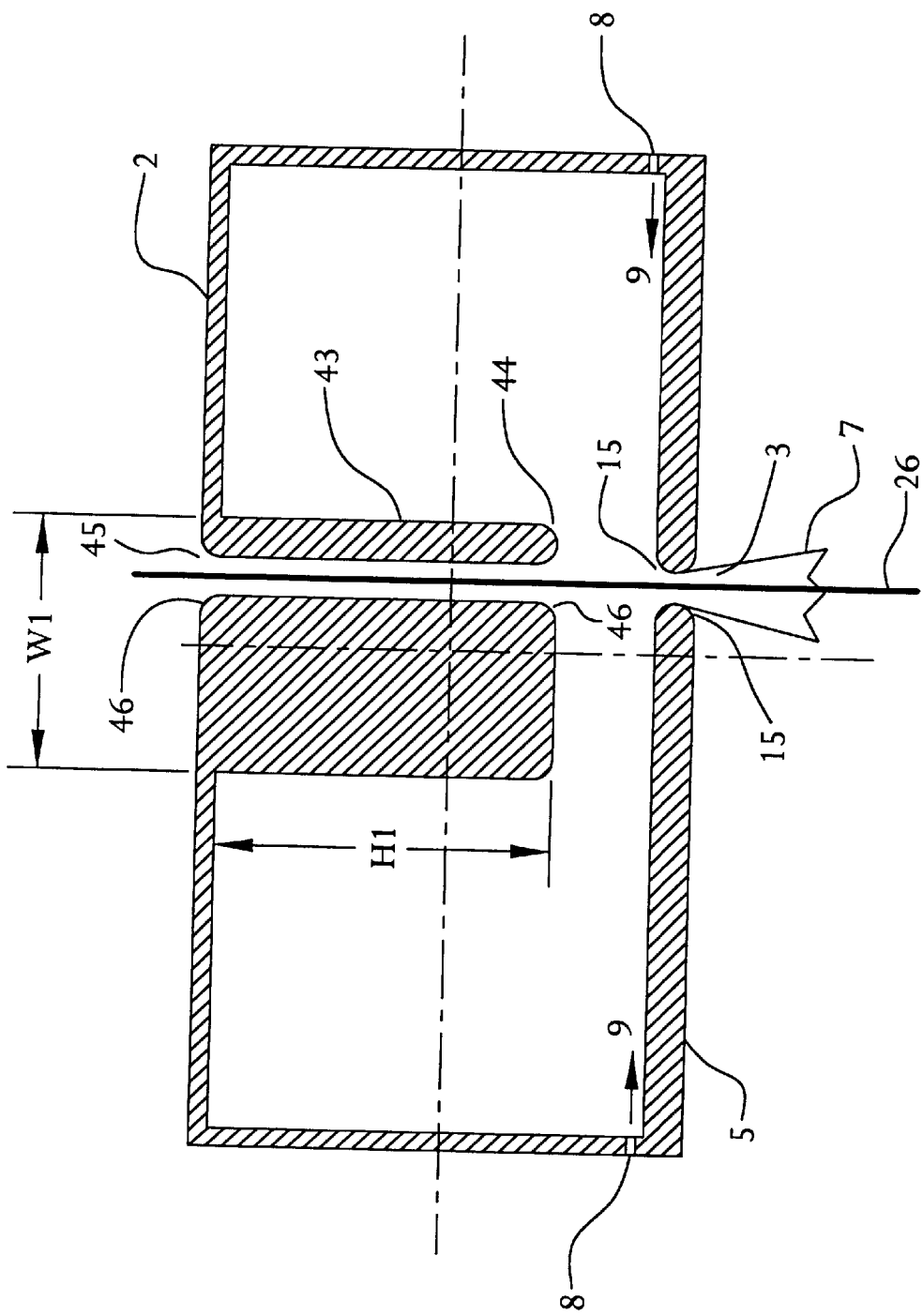
FIG. 11 shows a ridged waveguide structure having a wall slot and a slotted ridge for through treatment or two-sided treatment.

FIG. 11 illustrates a version of the ridged waveguide of FIG. 10 as modified to allow simultaneous treatment of both sides of a thin substrate 26. Ridge 43 is altered to have a slot 45 which is aligned with the wall slot 3 to allow the continuous passage of substrate 26 through the waveguide structure. Depending upon the mode and waveguide dimensions, a plasma discharge can be generated in both the gap of slot 3 as well as the region between the face of the ridged structure and the inner surface of the broad face of the waveguide.

Figure 12A:
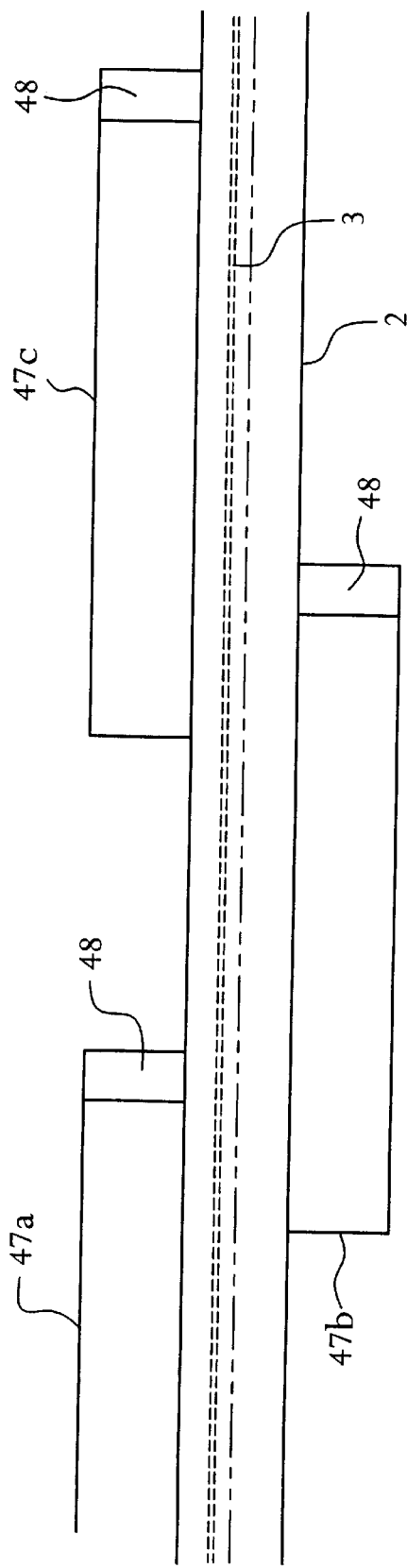
FIGS. 12A and 12B shows top and side views of a long waveguide structure with auxiliary coupling to multiple microwave sources.
Figure 12B:
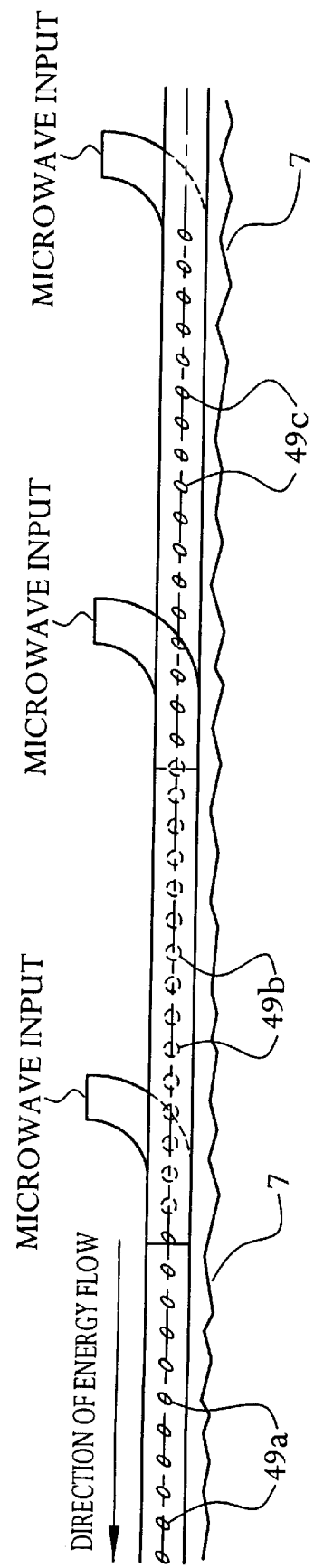

FIGS. 12A–B show an embodiment for the treatment of very wide substrates (e.g., substrates wider than the lengths readily usable with a given combination of microwave generator and waveguide). The section of a principal waveguide 2 would preferably have a constant cross-section and the wall slot 3 would have a constant offset from the centerline of the waveguide. In addition to an initial microwave generator (not illustrated), there would be additional microwave generators used to couple microwave energy into the principal waveguide 2 by means of side-wall directional couplers. These side-wall couplers 47a, 47b, and 47c couple microwave energy into the principal waveguide 2 via sets of wall apertures 49a, 49b, and 49c. The wall apertures can be in the shape of slots, circles, or ellipses with the position, size, and orientation of each aperture select to control the coupling. FIGS. 12A–B illustrate two types of apertures due to wall coupling being performed on alternating sides of slotted waveguide 2. Because of the presence of slot 3, the wall coupling is altered depending on the proximity of an aperture to the wall slot 3. The wall apertures can also be covered by a dielectric if a pressure or gas differential needs to be maintained across the principal waveguide's side wall.

Although the use of side-wall coupling restricts the use of a moveable top wall, the size, spacing, and orientation of the wall apertures and the use of a dielectric allows the degree of coupling to be adjusted to maintain a relatively constant power in the traveling microwave in the principal waveguide 2. Although shown in FIGS. 12A–B as narrow wall couplers, the "side-wall" couplers can either be in either the broad surface or the narrow surface of principal waveguide 2.

Figure 13:
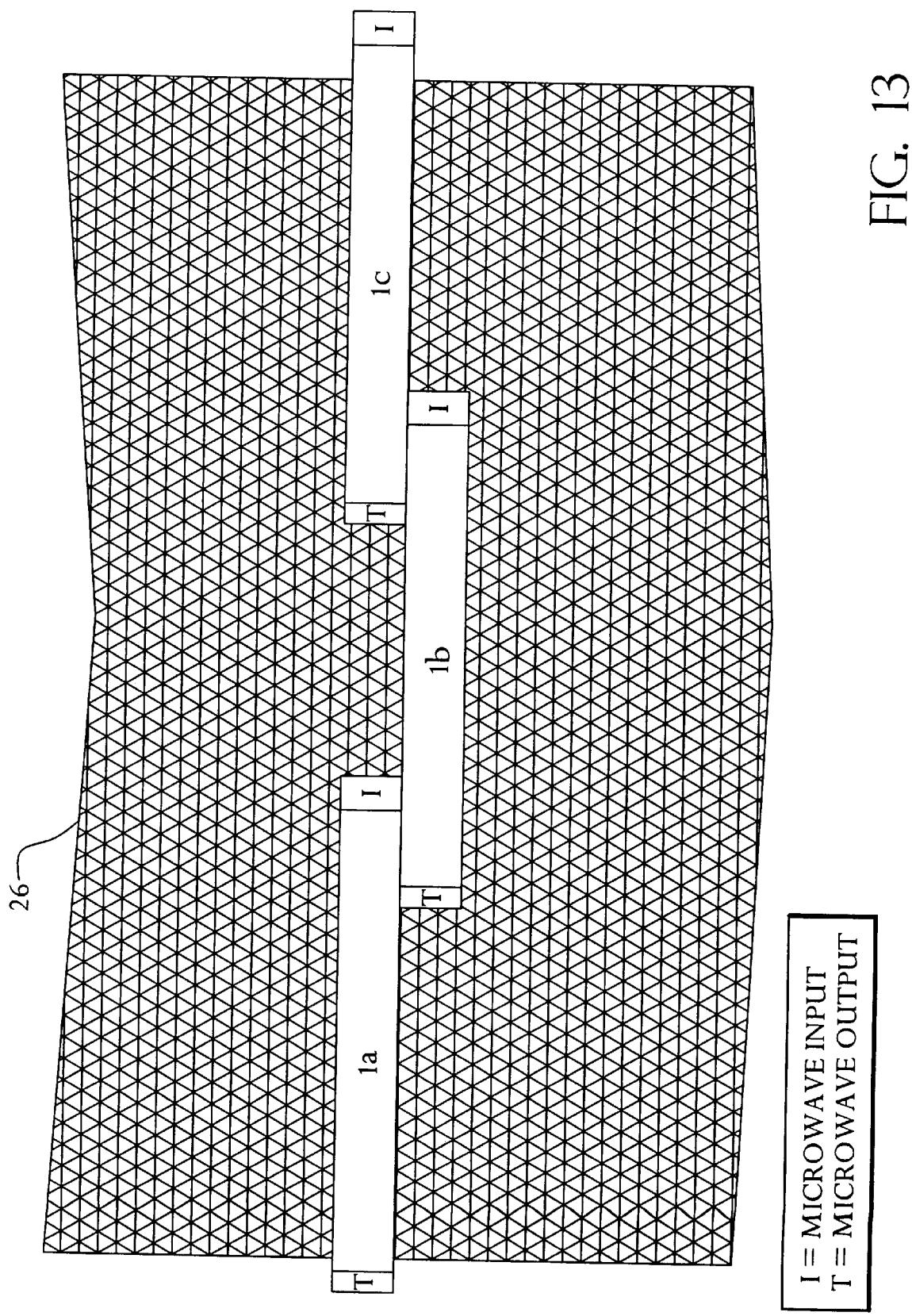
FIG. 13 shows staggered, modular waveguide applicators for treatment of wide (w>1 meter) substrates.

FIG. 13 shows a second alternative embodiment for the treating very wide substrates. A number of slotted waveguide applicators 1a, 1b, and 1c are overlapped as shown, so that their treatment regions overlap to cover the entire width of substrate 26. Each applicator section has its own microwave generator, waveguide, and termination. This simple method has the advantages of easy replacement of faulty modules and easy expansion to treatment of any width of substrate.

Experimental Results

A treatment system to the system illustrated in FIG. 3 was constructed using a WR 284 waveguide and tested under a variety of operating conditions. The WR 284 waveguide is a common waveguide size used for 2.45 GHz microwave power. The use of standard waveguides has advantages of availability and compatibility with existing hardware. The waveguide cutoff for the dominant mode is given by $\lambda_c = 2a$, where a is the broad face dimension of the waveguide. The cutoff frequency for a WR 284 waveguide is 2.08 GHz; i.e., higher frequencies will propagate, and lower frequencies will attenuate exponentially.

Note that WR 430 and WR 340 waveguides can also be used for 2.45-GHz microwave signals. Due to their large dimensions, these waveguides can operate at higher power levels without arcing inside the waveguide. An important criteria for a rectangular waveguide is that, to allow only the dominant mode to propagate and carry energy, one dimension of the waveguide should not exceed λ and the other should not exceed λ/2, where λ is the free space wavelength. For the present invention, these criteria along with the cutoff-frequency criterion allow the use of a waveguide that, at the input end, has the dimensions of, e.g., a WR 430 waveguide and, over a suitable length, tapers to the dimensions of, e.g., a WR 284 waveguide. A dominant $TE_{10}$ mode at 2.45 GHz will be maintained along the tapered section. The decrease in wall dimensions causes an increase in the field amplitudes within the waveguide, and hence an increase in wall currents. As such, a change in the waveguide width (dimension a) simultaneously with a change in the waveguide height (dimension b) may be used to compensate for power loss through a slot in order to maintain a constant or nearly constant voltage across the slot, so long as dimension a is not reduced below the cutoff frequency limit.

The WR 284 waveguide system was energized using a 750-watt, 2.54-GHz magnetron source. Several slotted waveguide sections were made with slot lengths varied from 28 centimeters to 38 centimeters, and slot widths tested from 0.5 millimeter to 5 millimeters. Gas flow rates were typically on the order of 1 to 2 liters/minute per centimeter of slot length. The process gases nitrogen, carbon dioxide, and argon were tested alone and with add mixtures of oxygen.

Stable, uniform discharges were obtained using nitrogen as a discharge gas and operated at pressures of 50 Torr to 250 Torr with a slot 38 centimeters in length and 0.5 millimeters in width at power densities of approximately 13 watts per centimeter of slot length. The input end of the slot was displaced approximately one centimeter from the centerline of the waveguide, and sloped uniformly to the inner edge of the side wall over the 38-centimeter length. The plasma plume generated by this discharge was typically 2 to 3 centimeters in length. Using argon gas with up to 3% oxygen added, stable discharges were obtained at atmospheric pressure without the need for auxiliary low-frequency excitation.

A slotted WR 284 waveguide was also configured with a planar aluminum electrode positioned 2.5 millimeters from the slotted waveguide face. By exciting the planar electrode with a 10-kHz, 5-kilovolt peak, pulse voltage having a 10-kHz repetition rate and approximately 1-microsecond rise time, a nitrogen discharge was sustained at 300 Torr using 400 watts of 2.45-GHz microwave power.

A polypropylene film was treated using a nitrogen discharge of a 38-centimeter slot. An input power of approximately 500 watts produced a discharge along the length of a 38-centimeter slot. The polypropylene film was positioned 2.5 centimeters from the slotted waveguide face and was translated at a rate of 38 centimeters/minutes. This treatment produced a wettable surface having a water contact angle of approximately 50±5 degrees. After rinsing and drying the sample, a water contact angle of approximately 60±5 degrees was obtained.

In general, the allowable working gas or gas mixture is a function of the operating pressure, discharge power, and waveguide structure geometry. High pressure (e.g., $P \geq 150$ Torr) typically requires the use of an inert gas such as argon or helium, narrower slits, and/or higher power. If the pressure gets low (e.g.. $P \leq 50$ Torr), a discharge may form within the waveguide. Nevertheless, certain waveguide structures of the present invention (e.g., FIG. 6a) can support operation at pressures below 50 Torr.

Although the present invention has been described in the context of waveguides that propagate microwave power, the present invention can also be implemented using electrical power in other frequency ranges. Changing the power frequency will affect the dimensions of the waveguide and may also affect the characteristics of plasma discharge.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the principle and scope of the invention as expressed in the following claims.

What is claimed is:

1. A plasma generator, comprising:
   (a) a power supply; and
   (b) a waveguide structure electrically connected to receive electrical power from the power supply and having a slot running along a surface of the waveguide structure, wherein:
      an effective electrical cross section of the waveguide structure varies along the length of the waveguide structure; and
      when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

2. The invention of claim 1, wherein the shape of the waveguide structure and the shape and position of the slot provide a relatively uniform average voltage across the slot along substantially the entire length of the slot.

3. The invention of claim 1, wherein the shape of the slot varies along the length of the slot.

4. The invention of claim 1, wherein the position of the slot relative to a longitudinal axis of the waveguide structure varies along the length of the slot.

5. The invention of claim 4, wherein the slot is angled on the surface of the waveguide structure such that the slot is closer to a center line of the surface at the power input end than at a power output end of the waveguide structure.

6. The invention of claim 1, comprising a plurality of the waveguide structures electrically connected to one or more power supplies and positioned relative to one other to provide a plurality of plasma discharges having a total effective length longer than the longest slot length of any one of the waveguide structures to enable uniform plasma treatment of substrates having a width greater than the longest slot length.

7. The invention of claim 1, wherein the waveguide structure has a vane pivotably mounted to an interior surface of the waveguide structure to enable control over the variation of the effective electrical cross section along the length of the waveguide structure.

8. The invention of claim 1, wherein the waveguide structure has a rectangular cross-section.

9. The invention of claim 8, wherein the waveguide structure is tapered such that the height of the rectangular cross section decreases along the length of the waveguide structure.

10. The invention of claim 1, wherein the waveguide structure has an elliptical cross-section.

11. The invention of claim 1, wherein the waveguide structure is a ridged structure.

12. The invention of claim 11, wherein the waveguide structure has a ridge whose cross section varies along the length of the waveguide structure.

13. The invention of claim 1, wherein the waveguide structure has a circular cross-section and center conductors to maintain specific field orientation of the traveling wave.

14. The invention of claim 1, wherein the power supply is a microwave generator and the electrical power is microwave power.

15. The invention of claim 1, wherein the length of the slot is greater than half the wavelength of the electrical power supplied by the power supply.

16. The invention of claim 1, wherein two faces in the waveguide structure that define the slot are contoured to provide a controlled electric field distribution near the slot.

17. The invention of claim 16, wherein at least one of the two faces has a dielectric coating.

18. The invention of claim 1, further comprising:
(c) an enclosure housing the waveguide structure to enable control over pressure and composition of the working gas; and
(d) a connecting waveguide structure connected between the power supply and the waveguide structure, wherein a dielectric window is positioned within the connecting waveguide structure to inhibit the flow of gas between the power supply and the enclosure to enable the power supply and the waveguide structure to operate in different gas conditions.

19. The invention of claim 18, further comprising:
(e) a vacuum pump configured to remove gas from the enclosure to enable the waveguide structure to operate with the working gas at a pressure less than and with a composition different from the gas conditions at the power supply.

20. The invention of claim 19, wherein the vacuum pump is configured to maintain a pressure between about 10 Torr and about one atmosphere inside the enclosure.

21. The invention of claim 20, wherein the vacuum pump is configured to maintain a pressure between about 50 Torr and about 200 Torr inside the enclosure.

22. The invention of claim 18, further comprising:
(e) a circulator having a waveguide structure load and configured between the power supply and the connecting waveguide structure to protect the power supply from excessive reflections of the electrical power that may occur due to impedance mismatches by dissipating reflected electrical power within the waveguide structure load;
(f) a triple-stub matching network and an E-H tuner configured on opposite sides of the connecting waveguide structure to provide impedance matching of the dielectric window and the waveguide structure to the power supply in order to optimize power transfer to the plasma discharge; and
(g) a waveguide structure terminator configured at the power output end of the waveguide structure to inhibit reflection of the electrical power.

23. The invention of claim 1, wherein the waveguide structure has a dielectric window positioned over the slot and partially filling an interior of the waveguide structure to isolate the discharge region of the slot from the rest of the waveguide structure.

24. The invention of claim 23, wherein the dielectric window has one or more gas passages configured to supply the working gas directly into the discharge region.

25. The invention of claim 23, wherein the dielectric window comprises a protective coating on a surface facing the discharge region.

26. The invention of claim 1, wherein the waveguide structure has a dielectric window mounted to an exterior surface of the waveguide structure over the slot to isolate the discharge region of the slot from the waveguide structure.

27. The invention of claim 1, further comprising:
(c) a rotatable treater drum electrically isolated from the waveguide structure and positioned near the slot in the waveguide structure to enable a substrate to be translated near the slot to express at least one side of the substrate to the plasma discharge.

28. The invention of claim 27, wherein an additional power supply is configured to apply an additional voltage between the drum and the waveguide structure to contribute to the generation of the plasma discharge.

29. The invention of claim 28, wherein:
at least one of the drum and the surface of the waveguide structure near the slot has a dielectric coating; and
the additional power supply is configured to provide either a low-frequency pulsed voltage or sinusoidal RF voltage between the drum and the waveguide structure to augment the plasma discharge.

30. The invention of claim 27, wherein the outer surface of the waveguide structure facing the drum is contoured to conform to the shape of the drum to provide a substantially uniform gap between the waveguide structure and the drum.

31. The invention of claim 30, wherein the waveguide structure has gas flow conduits for supplying the working gas directly into the gap between the waveguide structure and the drum.

32. The invention of claim 1, wherein:
the side of the waveguide structure near the slot has an extension mechanically separated from the rest of the waveguide structure to be capacitively coupled to the rest of the waveguide structure; and
an additional power supply is configured to apply an additional voltage between the extension and the rest of the waveguide structure to contribute to the generation of the plasma discharge.

33. The invention of claim 32, wherein:
the mechanical separation between the extension and the rest of the waveguide structure is filled with a dielectric material; and
the additional power supply is configured to provide either a low-frequency pulsed voltage or sinusoidal RF voltage between the extension and the rest of the waveguide structure to augment the plasma discharge.

34. The invention of claim 1, wherein the waveguide structure has two opposing slots such that a substrate can be passed through the waveguide structure in one slot and out the other slot to enable exposure of both sides of the substrate in the plasma discharge.

35. The invention of claim 34, wherein the waveguide structure is a ridged structure in which one of the slots runs through a ridge of the ridged waveguide structure.

36. The invention of claim 34, wherein the waveguide structure has a rectangular cross section that is tapered such that the height of the rectangular cross section decreases along the length of the waveguide structure.

37. The invention of claim 1, further comprising one or more additional power supplies, each electrically coupled to the waveguide structure at a different location along the waveguide structure to enable coupling of additional electrical power into the waveguide structure to enable a substantially uniform plasma discharge to be generated along the entire length of the slot.

38. The invention of claim 37, wherein the waveguide structure has a substantially constant cross section and the slot is substantially parallel to a longitudinal axis of the waveguide structure.

39. A plasma generator, comprising:

(a) a power supply;

(b) a waveguide electrically connected to receive electrical power from the power supply and having a slot running along a surface of the waveguide; and (c) one or more additional power supplies, each electrically coupled to the waveguide at a different location along the waveguide to enable coupling of additional electrical power into the waveguide to enable a substantially uniform plasma discharge to be generated along the entire length of the slot, wherein:

when the power supply supplies electrical power to the waveguide, the electrical power (1) propagates along the waveguide from a power input end towards a power output end of the waveguide in a traveling electromagnetic wave and (2) induces current within the waveguide that produces a voltage across the slot sufficient to generate a non-equilibrium plasma discharge in a working gas within a discharge region near the slot.

40. The invention of claim 39, wherein the waveguide has a substantially constant cross section and the slot is substantially parallel to a longitudinal axis of the waveguide.

41. A plasma generator, comprising:

(a) a power supply; and (b) a waveguide structure electrically connected to receive electrical power from the power supply and having a slot running along a surface of the waveguide structure, wherein:

the shape of the slot varies along the length of the slot; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

42. A plasma generator, comprising:

(a) a power supply; and (b) a waveguide structure electrically connected to receive electrical power from the power supply and having a slot running along a surface of the waveguide structure, wherein:

the position of the slot relative to a longitudinal axis of the waveguide structure varies along the length of the slot; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

43. The invention of claim 42, wherein the slot is angled on the surface of the waveguide structure such that the slot is closer to a center line of the surface at the power input end than at a power output end of the waveguide structure.

44. A plasma generator, comprising:

(a) a power supply; and (b) a waveguide structure electrically connected to receive electrical power from the power supply and having a slot running along a surface of the waveguide structure, wherein:

the waveguide structure has a rectangular cross-section;

the waveguide structure is tapered such that the height of the rectangular cross section decrease along the length of the waveguide structure; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

45. A plasma generator, comprising:

(a) a power supply; and (b) a waveguide structure electrically connected to receive electrical power from the power supply and having a slot running along a surface of the waveguide structure, wherein:

the waveguide structure has an elliptical cross-section and the shape of the waveguide structure and the shape and position of the slot provide a relatively uniform average voltage across the slot along substantially the entire length of the slot; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

46. A plasma generator, comprising:

(a) a power supply; and (b) a waveguide structure electrically connected to receive electrical power from the power supply and having a slot running along a surface of the waveguide structure, wherein:

the waveguide structure is a ridged structure and the shape of the waveguide structure and the shape and position of the slot provides a relatively uniform average across the slot along substantially the entire length of the slot; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

47. The invention of claim 46, wherein the waveguide structure has a ridge whose cross section varies along the length of the waveguide structure.

48. A plasma generator, comprising:

(a) a power supply; and (b) a waveguide structure electrically connected to receive electrical power from the power supply and having a slot running along a surface of the waveguide structure, wherein:
  the waveguide structure has a circular cross-section and center conductors to maintain specific field orientation of the traveling wave; and
  when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

49. A plasma generator, comprising:
(a) a power supply; and
(b) a waveguide structure electrically connected to receive electrical power from the power supply and having a slot running along a surface of the waveguide structure, wherein:
  two faces in the waveguide structure that define the slot are contoured to provide a controlled electric field distribution near the slot; and
  when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

50. A plasma generator, comprising:
(a) a power supply; and
(b) a waveguide structure electrically connected to receive electrical power from the power supply and having a slot running along a surface of the waveguide structure;
(c) an enclosure housing the waveguide structure to enable control over pressure and composition of the working gas;
(d) a connecting waveguide structure connected between the power supply and the waveguide structure, wherein a dielectric window is positioned within the connecting waveguide structure to inhibit the flow of gas between the power supply and the enclosure to enable the power supply and the waveguide structure to operate in different gas conditions;
(e) a circulator having a waveguide structure load and configured between the power supply and the connecting waveguide structure to protect the power supply from excessive reflections of the electrical power that may occur due to impedance mismatches by dissipating reflected electrical power within the waveguide structure load;
(f) a triple-stub matching network and an E-H tuner configured on opposite sides of the connecting waveguide structure to provide impedance matching of the dielectric window and the waveguide structure to the power supply in order to optimize power transfer to the plasma discharge; and
(g) a waveguide structure terminator configured at the power output end of the waveguide structure to inhibit reflection of the electrical power, wherein:
  when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

51. The invention of claim 50, further comprising:
(h) a vacuum pump configured to remove gas from the enclosure to enable the waveguide structure to operate with the working gas at a pressure less than and with a composition different from the gas conditions at the power supply.

52. A plasma generator, comprising:
(a) a power supply; and
(b) a waveguide structure electrically connected to receive electrical power from the power supply and having a slot running along a surface of the waveguide, wherein:
  the waveguide has a dielectric window positioned over the slot and partially filling an interior of the waveguide to isolate the discharge region of the slot from the rest of the waveguide; and
  when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

53. A plasma generator, comprising:
(a) a power supply; and
(b) a waveguide structure electrically connected to receive electrical power from the power supply and having a slot running along a surface of the waveguide structure, wherein:
  when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot;
  the waveguide structure has a dielectric window positioned over the slot and partially filling an interior of the waveguide structure to isolate the discharge region of the slot from the rest of the waveguide structure; and
  the dielectric window has one or more gas passages configured to supply the working gas directly into the discharge region.

54. A plasma generator, comprising:
(a) a power supply; and
(b) a waveguide structure electrically connected to receive electrical power from the power supply and having a slot running along a surface of the waveguide structure;
(c) a rotatable treater drum electrically isolated from the waveguide structure and positioned near the slot in the waveguide structure to enable a substrate to be translated near the slot to expose at least one side of the substrate to the plasma discharge; and (d) an additional power supply is configured to apply an additional voltage between the drum and the waveguide structure to contribute to generation of the plasma discharge, wherein:

the additional power supply is configured to provide either a low-frequency pulsed voltage or sinusoidal RF voltage between the drum and the waveguide structure to augment the plasma discharge; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

55. The invention of claim 54, wherein an outer surface of the waveguide structure facing the drum is contoured to conform to the shape of the drum to provide a substantially uniform gap between the waveguide structure and the drum.

56. The invention of claim 54, wherein the waveguide structure has a gas flow conduits for supplying the working gas directly into the gap between the waveguide structure and the drum.

57. A plasma generator, comprising:

(a) a power supply; and (b) a waveguide structure electrically connected to receive electrical power from the power supply and having a slot running along a surface of the waveguide structure, wherein:

the side of the waveguide structure near the slot has an extension mechanically separated from the rest of the waveguide structure to be capacitively coupled to the rest of the waveguide structure;

an additional power supply is configured to apply an additional voltage between the extension and the rest of the waveguide structure to contribute to the generation of the plasma discharge; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

58. The invention of claim 57, wherein:

the mechanical separation between the extension and the rest of the waveguide structure is filled with a dielectric material; and the additional power supply is configured to provide either a low-frequency pulsed voltage of sinusoidal RF voltage between the extension and the rest of the waveguide structure to augment the plasma discharge.

59. A plasma generator, comprising:

(a) a power supply; and (b) a waveguide structure electrically connected to receive electrical power from the power supply and having a slot running along a surface of the waveguide structure, wherein:

the waveguide structure has two opposing slots such that a substrate can be passed through the waveguide structure in one slot and out the other slot to enable exposure of both sides of the substrate to the plasma discharge; and when the power supply supplies electrical power to the waveguide structure, the electrical power (1) propagates along the waveguide structure from a power input end towards a power output end of the waveguide structure in a traveling electromagnetic wave and (2) induces current within the waveguide structure that produces a voltage across the slot sufficient to generate a non-equilibrium plasma discharge in a working gas within a discharge region near the slot.

60. The invention of claim 59, wherein the waveguide structure is a ridged structure in which one of the slots runs through a ridge of the ridged waveguide structure.

61. The invention of claim 59, wherein the waveguide structure has a rectangular cross section that is tapered such that the height of the rectangular cross section decreases along the length of the waveguide structure.

62. A method for generating plasma discharge, comprising the steps of:

providing a working gas for a waveguide structure having a slot running along a surface of the waveguide structure; and (b) supplying electrical power from a power supply electrically connected to the waveguide structure, wherein:

an effective electrical cross section of the waveguide structure varies along the length of the waveguide structure; and the electrical power (1) propagates along the waveguide structure from a power input end towards a power output end of the waveguide structure in a traveling wave and (2) induces current within the waveguide structure that produces a voltage across the slot sufficient to generate a non-equilibrium plasma discharge in the working gas within a discharge region near the slot.

* * * * *